(12) United States Patent
Maruyama

(10) Patent No.: US 10,840,462 B2
(45) Date of Patent: *Nov. 17, 2020

(54) SEMICONDUCTOR DEVICE INCLUDING SEMICONDUCTOR LAYERS HAVING DIFFERENT SEMICONDUCTOR MATERIALS

(71) Applicant: Japan Display Inc., Tokyo (JP)

(72) Inventor: Satoshi Maruyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/676,561

(22) Filed: Nov. 7, 2019

(65) Prior Publication Data

US 2020/0075871 A1 Mar. 5, 2020

Related U.S. Application Data

(63) Continuation of application No. 16/174,376, filed on Oct. 30, 2018, now Pat. No. 10,510,969, which is a
(Continued)

(30) Foreign Application Priority Data

Sep. 26, 2016 (JP) .................................. 2016-186671

(51) Int. Cl.
*H01L 27/32* (2006.01)
*H01L 51/00* (2006.01)
(Continued)

(52) U.S. Cl.
CPC ...... *H01L 51/0094* (2013.01); *H01L 27/1225* (2013.01); *H01L 27/1255* (2013.01);
(Continued)

(58) Field of Classification Search
CPC ............. H01L 51/0094; H01L 51/0512; H01L 27/3248; H01L 51/5012; H01L 27/12
See application file for complete search history.

(56) References Cited

U.S. PATENT DOCUMENTS 10,153,446 B2 12/2018 Maruyama
10,510,969 B2 * 12/2019 Maruyama .......... H01L 27/1225
(Continued)

FOREIGN PATENT DOCUMENTS

CN 101123222 A 2/2008
CN 102812555 A 12/2012
(Continued)

OTHER PUBLICATIONS

Korean Office Action dated Oct. 20, 2018 for the corresponding Korean patent application No. 10-2017-0101142, with partial English translation.
(Continued)

*Primary Examiner* — Bilkis Jahan
(74) *Attorney, Agent, or Firm* — Michael Best & Friedrich LLP

(57) ABSTRACT

A display device having an improved display characteristics and reduced manufacturing cost is provided. The display device includes a plurality of pixels arranged on a surface of a substrate. The plurality of pixels each include: a light-emitting element; a driving transistor; a selecting transistor; and a retention capacitor. The driving transistor has a bottom-gate structure. The driving transistor has a semiconductor layer containing a first semiconductor. The retention capacitor has a first electrode and a second electrode. The first electrode doubles as a gate of the driving transistor. The second electrode is disposed at a lower layer than the first electrode and contains a second semiconductor.

6 Claims, 29 Drawing Sheets

Related U.S. Application Data continuation of application No. 15/682,649, filed on Aug. 22, 2017, now Pat. No. 10,153,446.

(51) Int. Cl.
*H01L 27/12* (2006.01)
*H01L 51/05* (2006.01)
*H01L 51/50* (2006.01)

(52) U.S. Cl.
CPC ...... *H01L 27/3248* (2013.01); *H01L 27/3262* (2013.01); *H01L 27/3265* (2013.01); *H01L 51/0512* (2013.01); *H01L 27/12* (2013.01); *H01L 51/5012* (2013.01)

(56) References Cited

U.S. PATENT DOCUMENTS

| | | |
|---|---|---|
| 2003/0067434 A1 | 4/2003 | Haga et al. |
| 2008/0067519 A1 | 3/2008 | Sakurai et al. |
| 2011/0174770 A1 | 7/2011 | Hautala |
| 2011/0316007 A1 | 12/2011 | Sagawa |
| 2012/0007158 A1* | 1/2012 | Yoon .................. H01L 29/22 257/295 |
| 2012/0061673 A1 | 3/2012 | Yamazaki et al. |
| 2012/0175603 A1 | 7/2012 | Takeuchi |
| 2013/0037807 A1 | 2/2013 | Fukaya |
| 2013/0088460 A1 | 4/2013 | Ahn et al. |
| 2013/0214279 A1 | 8/2013 | Nishimura et al. |
| 2013/0221356 A1 | 8/2013 | Yamazaki et al. |
| 2014/0332771 A1 | 11/2014 | Byun |
| 2015/0060832 A1 | 3/2015 | Ito et al. |
| 2015/0206928 A1 | 7/2015 | Kimura et al. |
| 2016/0005804 A1 | 1/2016 | Oh et al. |
| 2016/0204185 A1 | 7/2016 | Iijima et al. |
| 2016/0204266 A1* | 7/2016 | Seo .................. H01L 29/66969 257/43 |

FOREIGN PATENT DOCUMENTS

| | | |
|---|---|---|
| CN | 104134424 A | 11/2014 |
| JP | 2004-046054 A | 2/2004 |
| JP | 2015-225104 A | 12/2015 |
| KR | 10-2013-0060200 A | 6/2013 |
| KR | 10-2013-0099847 A | 9/2013 |
| KR | 10-2014-0133669 A | 11/2014 |
| KR | 10-2016-0004843 A | 1/2016 |
| TW | 200813581 A | 3/2008 |
| TW | 201230340 A | 7/2012 |

OTHER PUBLICATIONS

Taiwanese Office Action dated Mar. 22, 2018 for the corresponding Taiwanese Application No. 106124842.

Chinese Office Action dated Nov. 5, 2019 for the corresponding Chinese patent application No. 201710691008.0, with partial English translation.

* cited by examiner

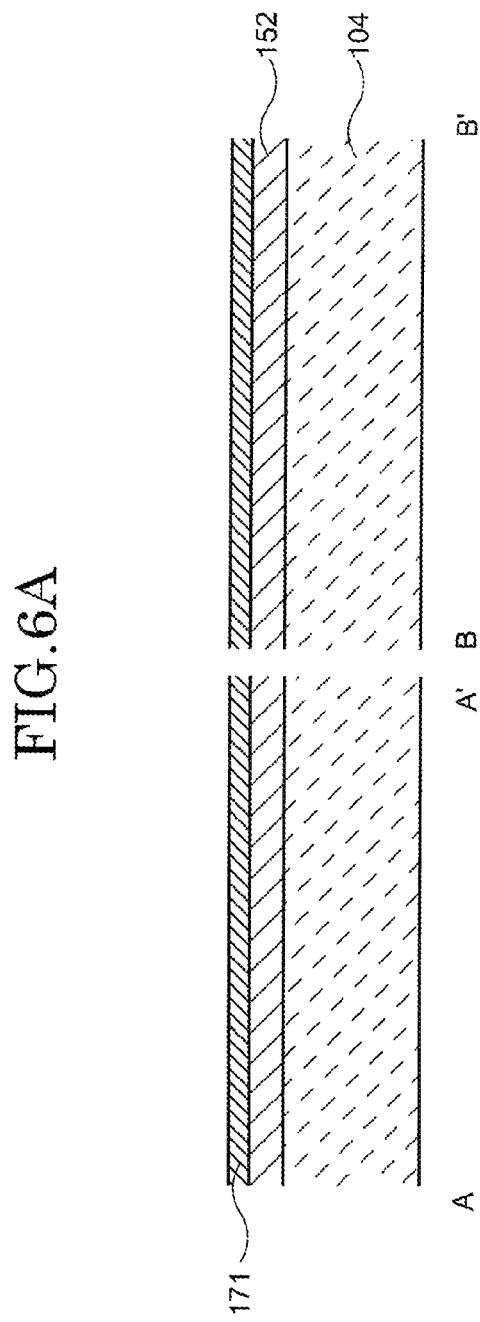

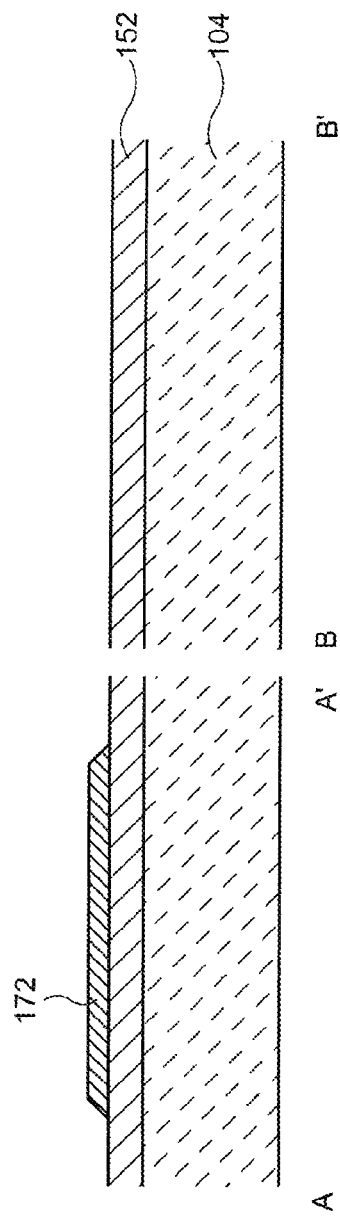

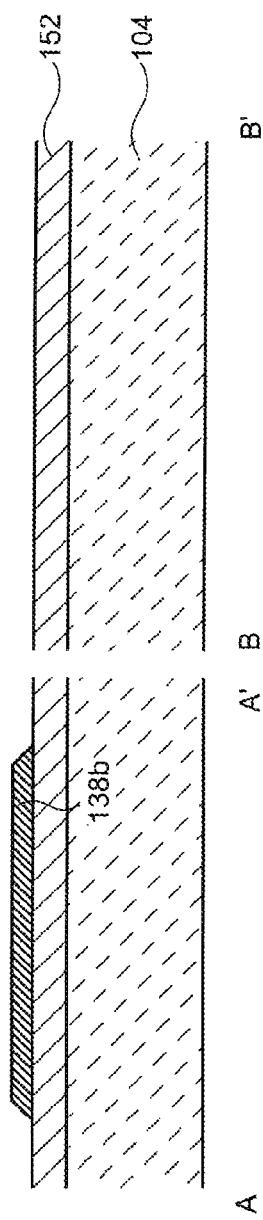

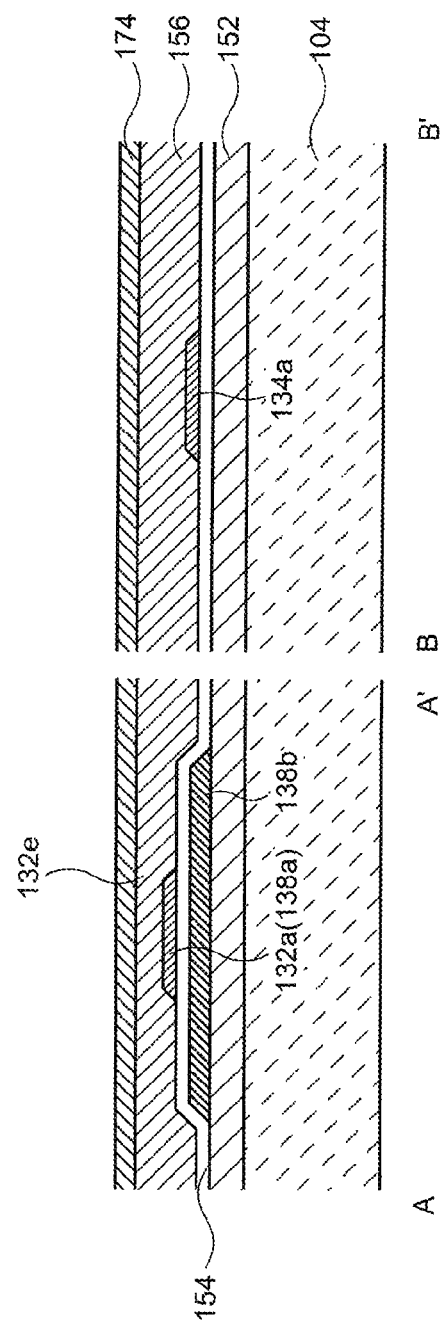

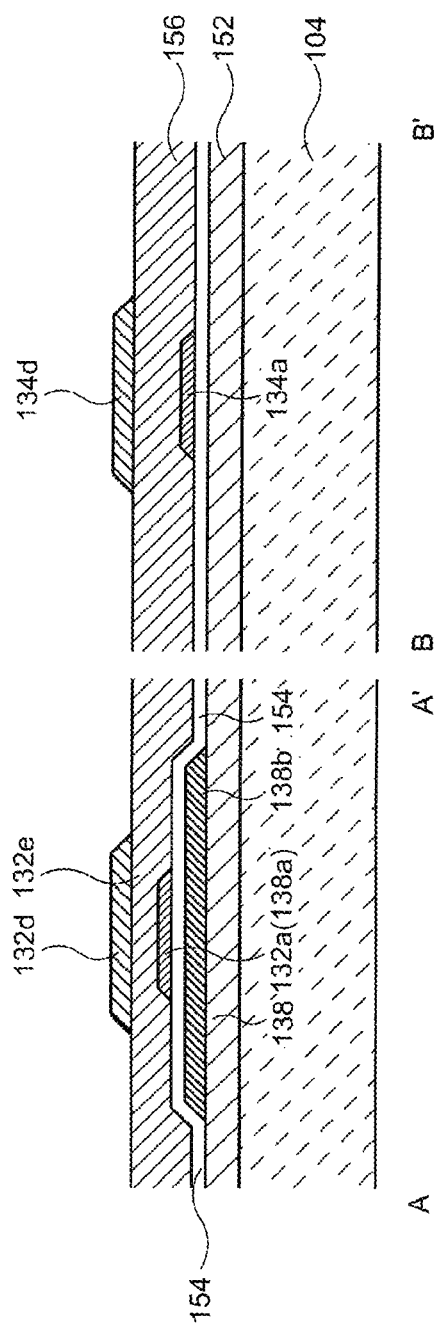

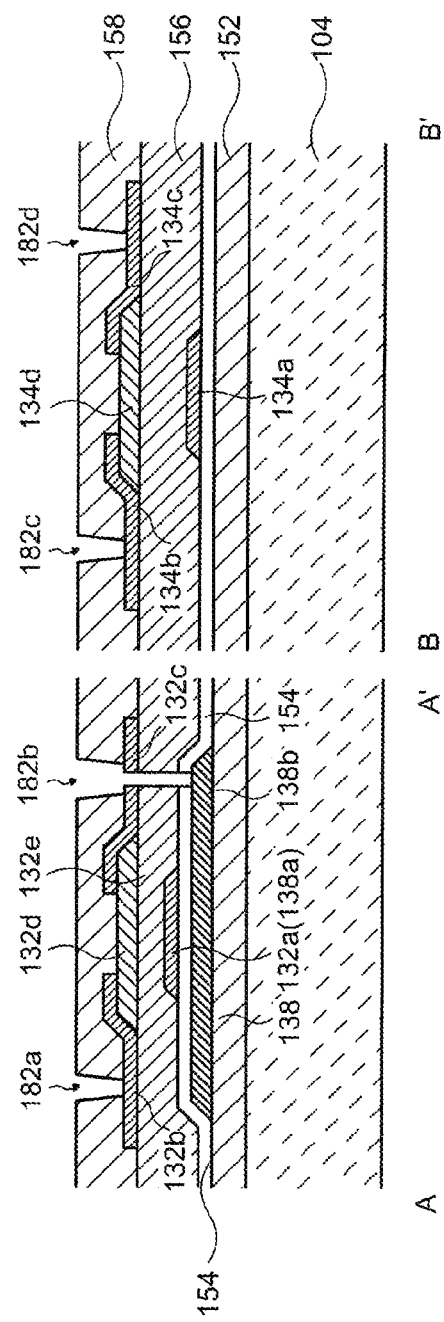

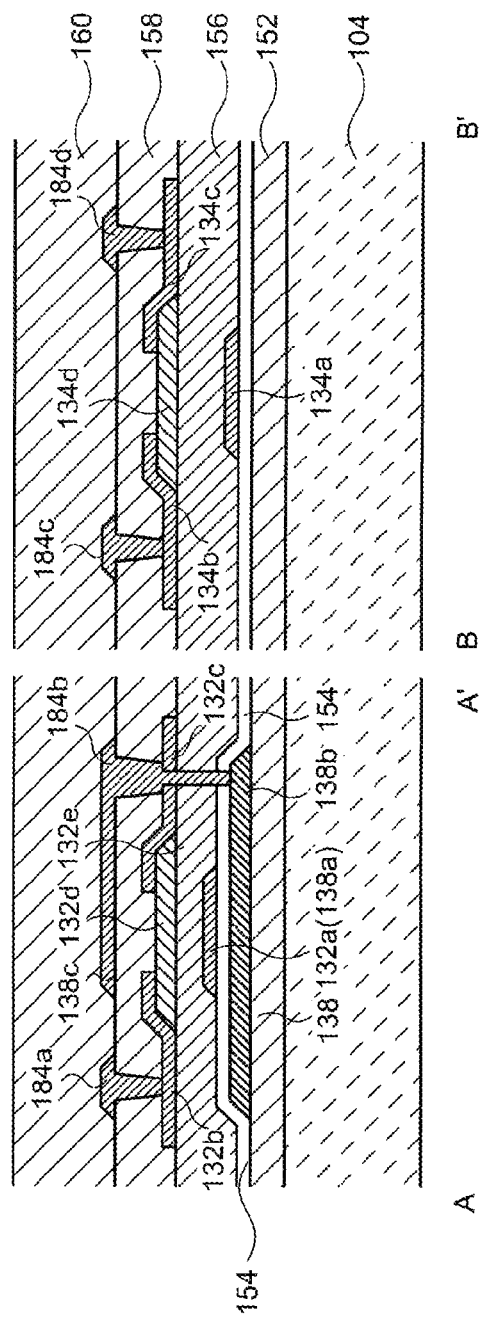

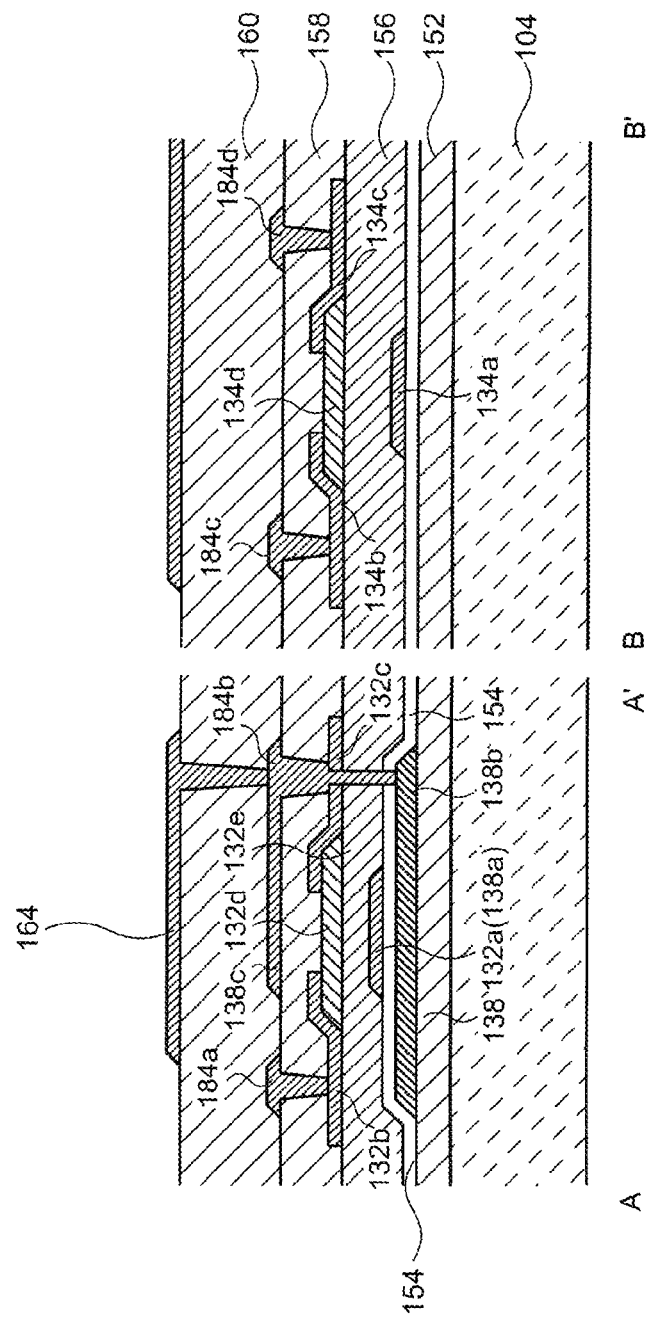

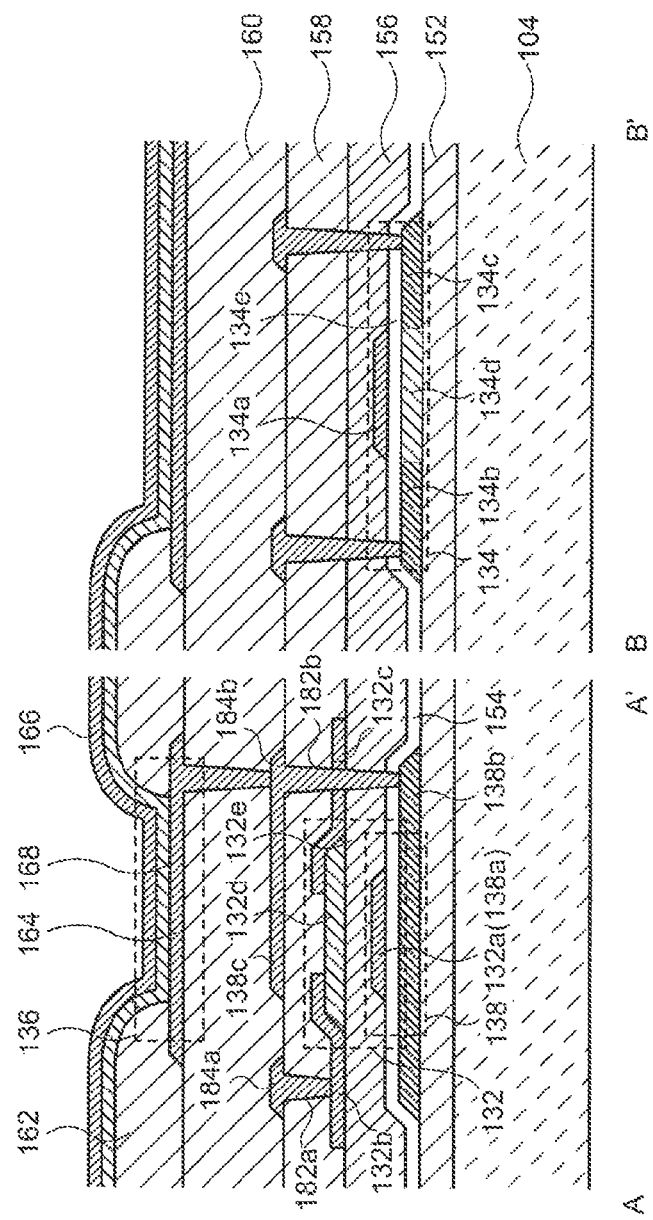

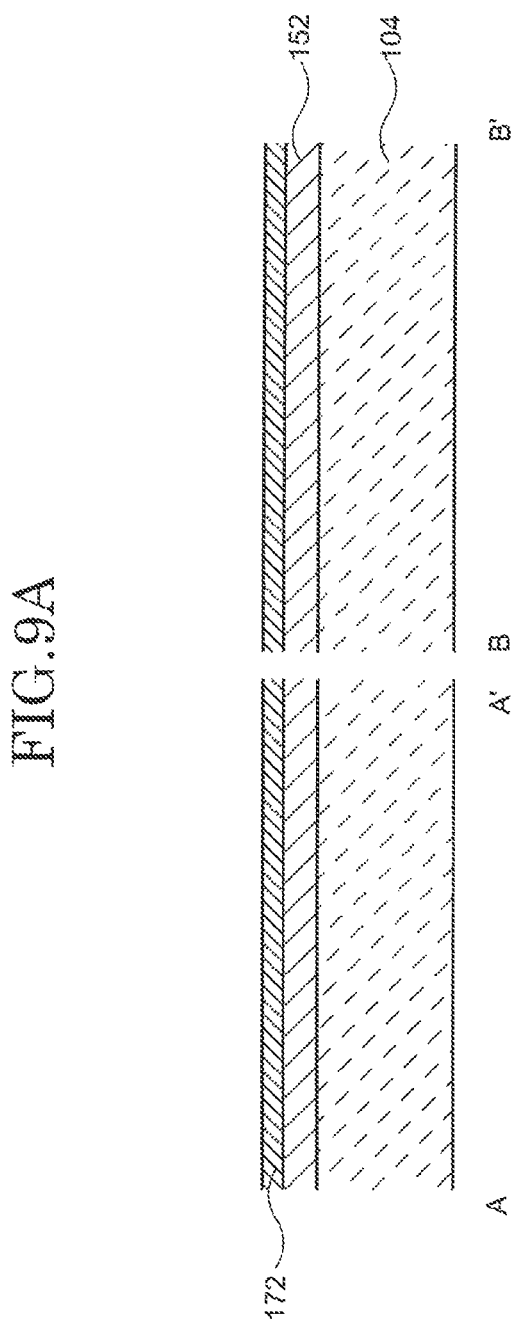

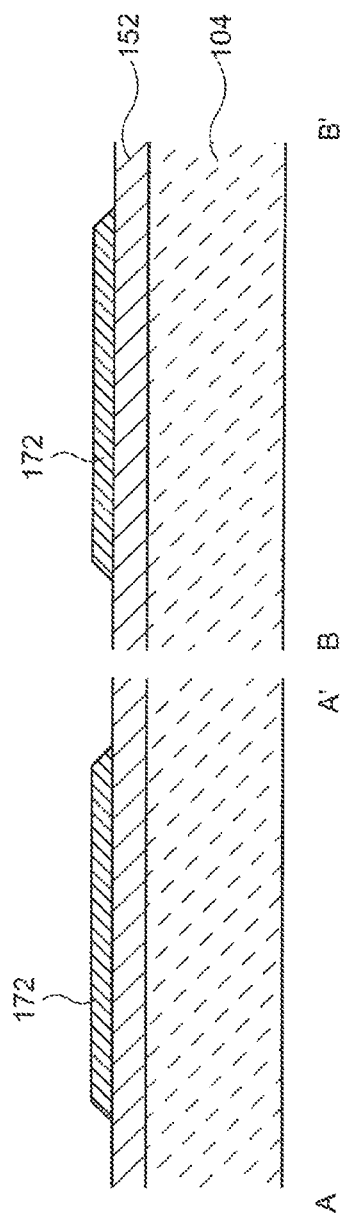

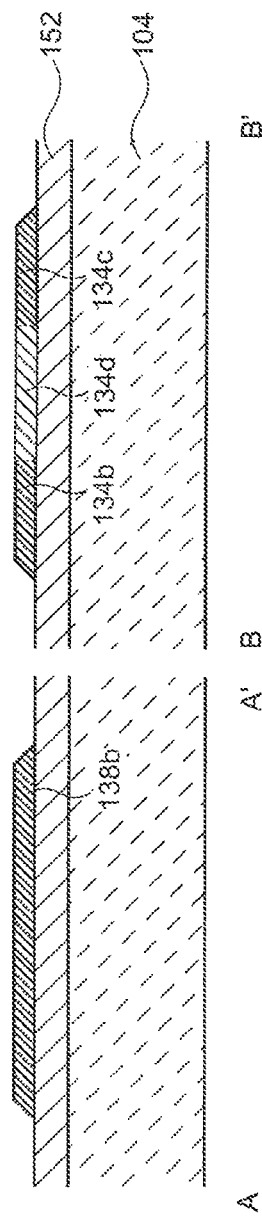

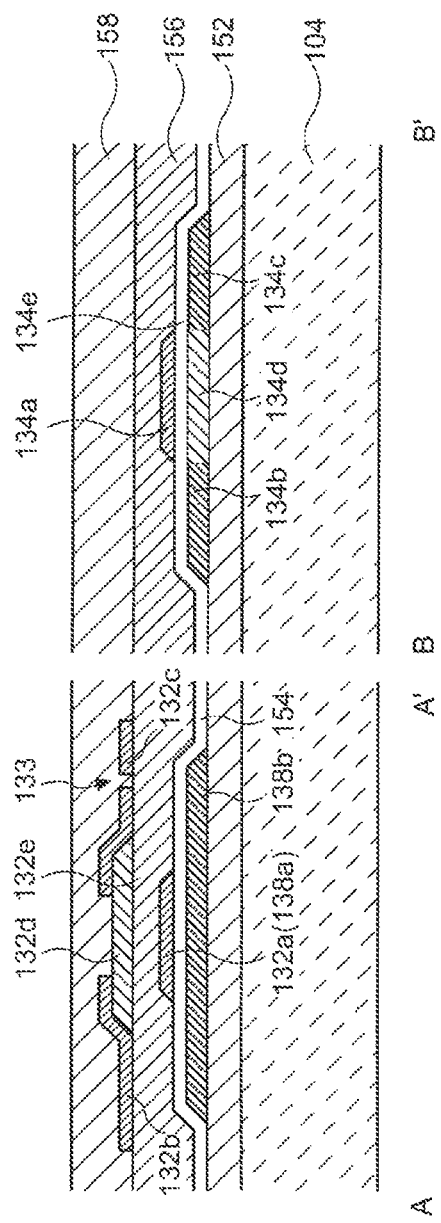

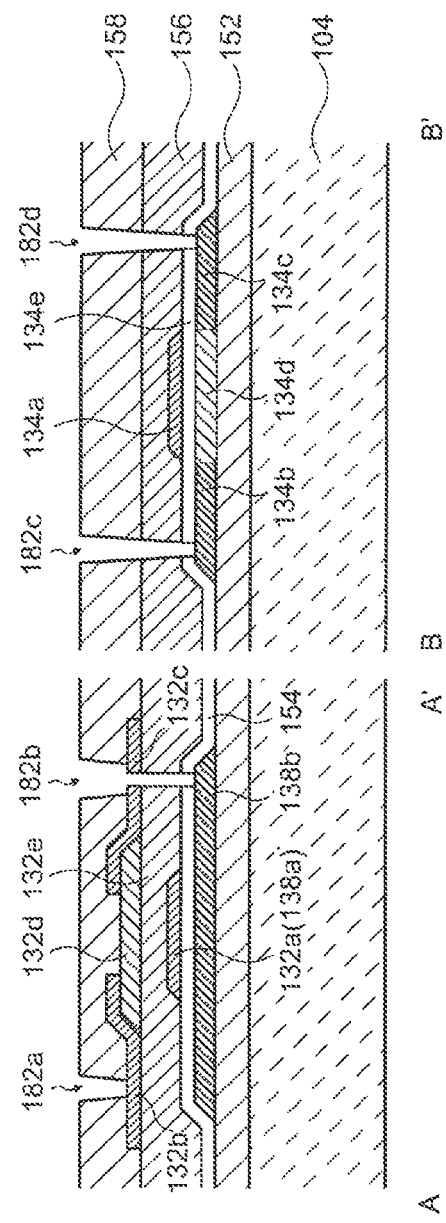

SEMICONDUCTOR DEVICE INCLUDING SEMICONDUCTOR LAYERS HAVING DIFFERENT SEMICONDUCTOR MATERIALS

CROSS REFERENCE TO RELATED APPLICATIONS

This application is a continuation of U.S. patent application Ser. No. 16/174,376, filed on Oct. 30, 2018, which, in turn, is a continuation of U.S. patent application Ser. No. 15/682,649 (now U.S. Pat. No. 10,153,446), filed on Aug. 22, 2017. Further, this application is based on and claims the benefit of priority from the prior Japanese Patent Application No. 2016-186671, filed on Sep. 26, 2016, the entire contents of which are incorporated herein by reference.

FIELD

The present invention relates to display devices and, in particular, to a display device using a silicon semiconductor and an oxide semiconductor.

BACKGROUND

Low-temperature polysilicon (LTPS), which is used in liquid crystal display devices, are widely used in current small-to-medium-sized display devices, as it has a high carrier mobility. In the field of organic EL display devices, too, the development of an array step has been advanced on the basis of LTPS technology.

However, it is difficult to form a sufficiently uniform LTPS layer in an excimer laser anneal (ELA) step. Variations in the characteristics of thin-film transistors (TFTs) due to nonuniformity in LTPS cause nonuniformity in the luminance of the organic EL display devices.

To address this problem, measures to reduce variations in the characteristics of the TFTs have been taken by forming a correcting circuit in a peripheral circuit or a pixel. Further, such measures have been taken in the ELA step as to perform laser irradiation over and over multiple times. However, measures such as these pose problems in terms of apparatus cost, material cost of a laser, and the like.

To address this problem, not only transistors made of polycrystalline silicon that are believed to be high in driving capability but also transistors using a transparent amorphous oxide semiconductor that are expected to be small in characteristic variation have been studied to reduce power consumption and take measures against variations in the characteristics of the transistors.

For example, Japanese Unexamined Patent Application Publication No. 2015-225104 discloses a display device including two or more transistors in one pixel, wherein the two or more transistors include a first transistor whose channel semiconductor layer is made of polycrystalline silicon and a second transistor whose channel semiconductor layer is made of an oxide semiconductor.

SUMMARY

A display device according to an embodiment of the present invention includes a plurality of pixels arranged on a surface of a substrate. The plurality of pixels each include: a light-emitting element; a driving transistor; a selecting transistor; and a retention capacitor. The driving transistor has a bottom-gate structure, and includes a semiconductor layer containing a first semiconductor. The retention capacitor has a first electrode and a second electrode. The first electrode doubles as a gate of the driving transistor. The second electrode is disposed at a lower layer than the first electrode and contains a second semiconductor.

BRIEF DESCRIPTION OF DRAWINGS

FIG. 6A is a cross-sectional view illustrating a method for manufacturing a display device according to an embodiment of the present invention;

FIG. 6B is a cross-sectional view illustrating a method for manufacturing a display device according to an embodiment of the present invention;

FIG. 6C is a cross-sectional view illustrating a method for manufacturing a display device according to an embodiment of the present invention;

FIG. 6F is a cross-sectional view illustrating a method for manufacturing a display device according to an embodiment of the present invention;

FIG. 6G is a cross-sectional view illustrating a method for manufacturing a display device according to an embodiment of the present invention;

FIG. 6K is a cross-sectional view illustrating a method for manufacturing a display device according to an embodiment of the present invention;

FIG. 6M is a cross-sectional view illustrating a method for manufacturing a display device according to an embodiment of the present invention;

FIG. 6N is a cross-sectional view illustrating a method for manufacturing a display device according to an embodiment of the present invention;

FIG. 6O is a cross-sectional view illustrating a method for manufacturing a display device according to an embodiment of the present invention;

FIG. 8 is a cross-sectional view illustrating a configuration of a pixel of a display device according to an embodiment of the present invention;

FIG. 9A is a cross-sectional view illustrating a method for manufacturing a display device according to an embodiment of the present invention;

FIG. 9B is a cross-sectional view illustrating a method for manufacturing a display device according to an embodiment of the present invention;

FIG. 9C is a cross-sectional view illustrating a method for manufacturing a display device according to an embodiment of the present invention;

FIG. 9E is a cross-sectional view illustrating a method for manufacturing a display device according to an embodiment of the present invention;

FIG. 9F is a cross-sectional view illustrating a method for manufacturing a display device according to an embodiment of the present invention.

DESCRIPTION OF EMBODIMENTS

Figure 1:
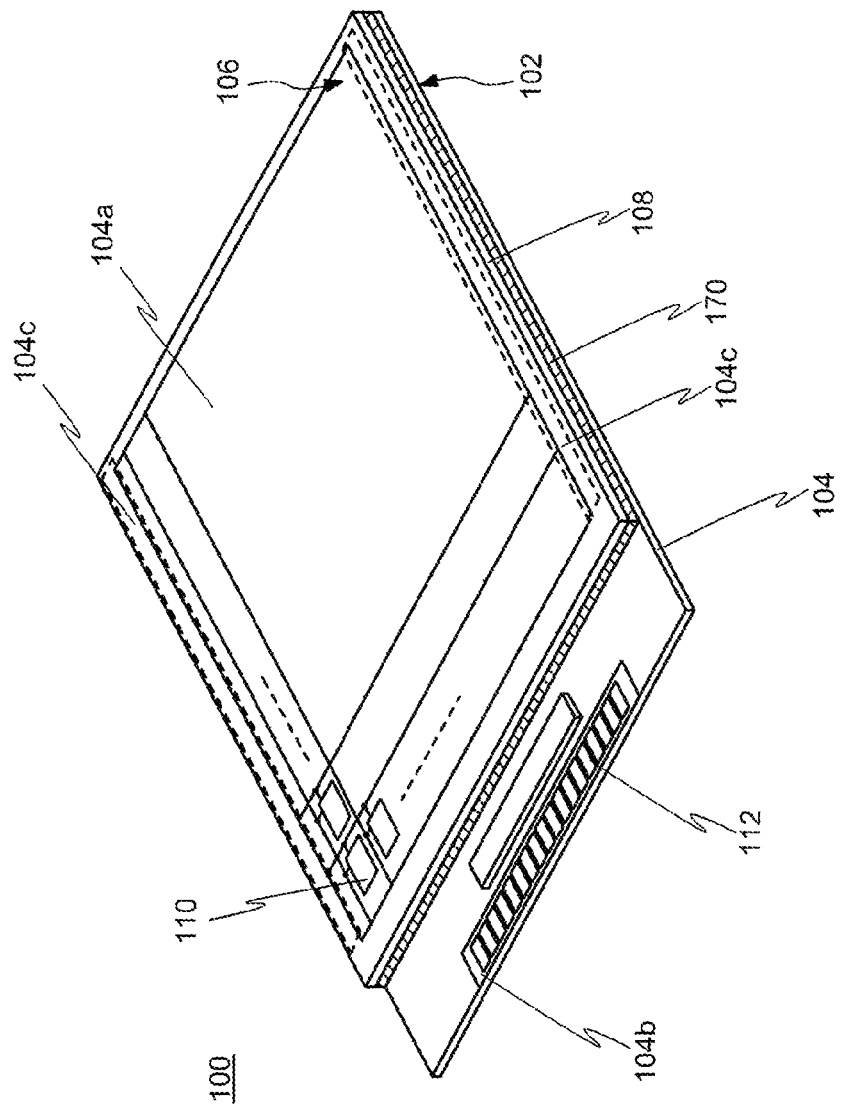
FIG. 1 is a perspective view schematically illustrating a configuration of a display device according to an embodiment of the present invention.

In the invention described in Japanese Unexamined Patent Application Publication No. 2015-225104, each pixel has a mixture of a first transistor whose channel semiconductor layer is made of polycrystalline silicon and a second transistor whose channel semiconductor layer is made of an oxide semiconductor.

However, Japanese Unexamined Patent Application Publication No. 2015-225104 fails to disclose a technology in which not only a plurality of pixel circuits but also a circuit including driving circuits that drive the pixel circuits have a mixture of transistors whose channel semiconductor layers are made of different semiconductor materials.

It is therefore an object of the present invention to provide a display device whose display characteristics are improved and whose manufacturing cost is reduced by having, in a plurality of pixel circuits and a circuit including driving circuits that drive the pixel circuits, a mixture of transistors whose channel semiconductor layers are made of different semiconductor materials.

In the following, display devices according to some embodiments of the present invention are described in detail with reference to the drawings. It should be noted that a display device of the present invention is not limited to any of the embodiments described below but may be implemented in various modifications. All of the embodiments are described by giving the same components the same reference numerals. Further, for convenience of explanation, the dimensional ratios of the drawings may be different from actual ratios, and some of the components may be omitted from the drawings.

First Embodiment

[Appearance Configuration]

FIG. 1 is a perspective view illustrating an appearance configuration of a display device 100 according to a first embodiment. The appearance configuration of the display device 100 according to the first embodiment is described with reference to FIG. 1.

The display device 100 according to the first embodiment includes an array substrate 102 and a counter substrate 106.

The array substrate 102 includes at least a first substrate 104, a plurality of pixels 110, a peripheral circuit (not illustrated), and a plurality of connection terminals 112.

The first substrate 104 has a display area 104a, a terminal area 104b, and a peripheral circuit area 104c disposed on a surface thereof. The first substrate 104 serves as a support for the plurality of pixels 110. The first substrate 104 can be made of a material such as a glass substrate, an acrylic resin substrate, an alumina substrate, or a polyimide substrate. The first substrate 104 may be a flexible substrate. The flexible substrate is made of a resin material. It is preferable that the resin material be a high molecular material containing an imide bond in a repeating unit. For example, the resin material is polyimide. Specifically, the first substrate 104 is a film substrate obtained by molding polyimide into a sheet.

The plurality of pixels 110 are arranged on the surface of the first substrate 104. The display area 104a is an area where the plurality of pixels 110 are arranged. In the first embodiment, the plurality of pixels 110 are arranged in rows and columns. The plurality of pixels 110 may be arranged in any number. For example, the plurality of pixels 110 may be arranged in a matrix with m rows and n columns (where m and n are integers). As will be described later, each of the plurality of pixels 110 is constituted by a pixel circuit 130 including at least a driving transistor 132, a selecting transistor 134, a light-emitting element 136, and a retention capacitor 138 (FIG. 3), although these components are not illustrated in FIG. 1.

The peripheral circuit (e.g. a control circuit 120, a scanning line driving circuit 122, a video line driving circuit 124, a drive power circuit 126, and a reference power circuit 128, which will be described later) is disposed on the surface of the first substrate 104. The peripheral circuit area 104c is an area where the peripheral circuit is disposed. The peripheral circuit drives the pixel circuit 130 of each of the plurality of pixels 110 and controls how the plurality of pixels 110 emit light.

The plurality of connection terminals 112 are disposed at one edge of the first substrate 104 and outside of the counter substrate 106. The terminal area 104b is an area where the plurality of connection terminals 112 are disposed. To the plurality of connection terminals 112, a circuit board (not illustrated) is connected. The circuit board connects the display device 100 to a device that outputs video signals, a power source, and the like. The plurality of connection terminals 112 have outwardly exposed contacts connected to the circuit board.

The counter substrate 106 includes a second substrate 108. The second substrate 108 may be similar to the first substrate 104. The second substrate 108 is provided on an upper surface of the display area 104a so as to face the first substrate 104. The second substrate 108 is fixed to the first substrate 104 by a sealant 170 surrounding the display area 104a. The display area 104a disposed on the first substrate 104 is sealed with the second substrate 108 and the sealant 170. It should be noted that it is not always necessary to use the sealant 170 to fix the second substrate 108 to the first substrate 104, and it is possible to use another means to do so. A possible example is to use an adhesive filler or the like. In this case, the display area 104a is sealed with the second substrate 108 and the adhesive filler. It is of course possible to use another method.

It should be noted that although the display device 100 according to the present embodiment includes the aforementioned second substrate 108, the second substrate 108 is not limited to a plate-like member but may be replaced by a film member or a sealing member coated with resin or the like.

The counter substrate 106 may further include a color filter, a light-blocking layer, a polarizing plate, a retardation film, and the like, although these components are not illustrated. The color filter is disposed in places facing each separate pixel 110. The light-blocking layer (also called "black matrix") is disposed in places demarcating each separate pixel 110. The polarizing plate and the retardation film cover the plurality of pixels 110 and are disposed on an outer surface of the counter substrate 106. The polarizing plate and the retardation film are disposed to suppress a deterioration in viewability due to reflection at a pixel electrode of outside light having entered the display device 100.

The foregoing has described the appearance configuration of the display device 100 according to the first embodiment. The following describes a circuit configuration of the display device 100 according to the first embodiment with reference to the drawings.

[Circuit Configuration]

Figure 2:
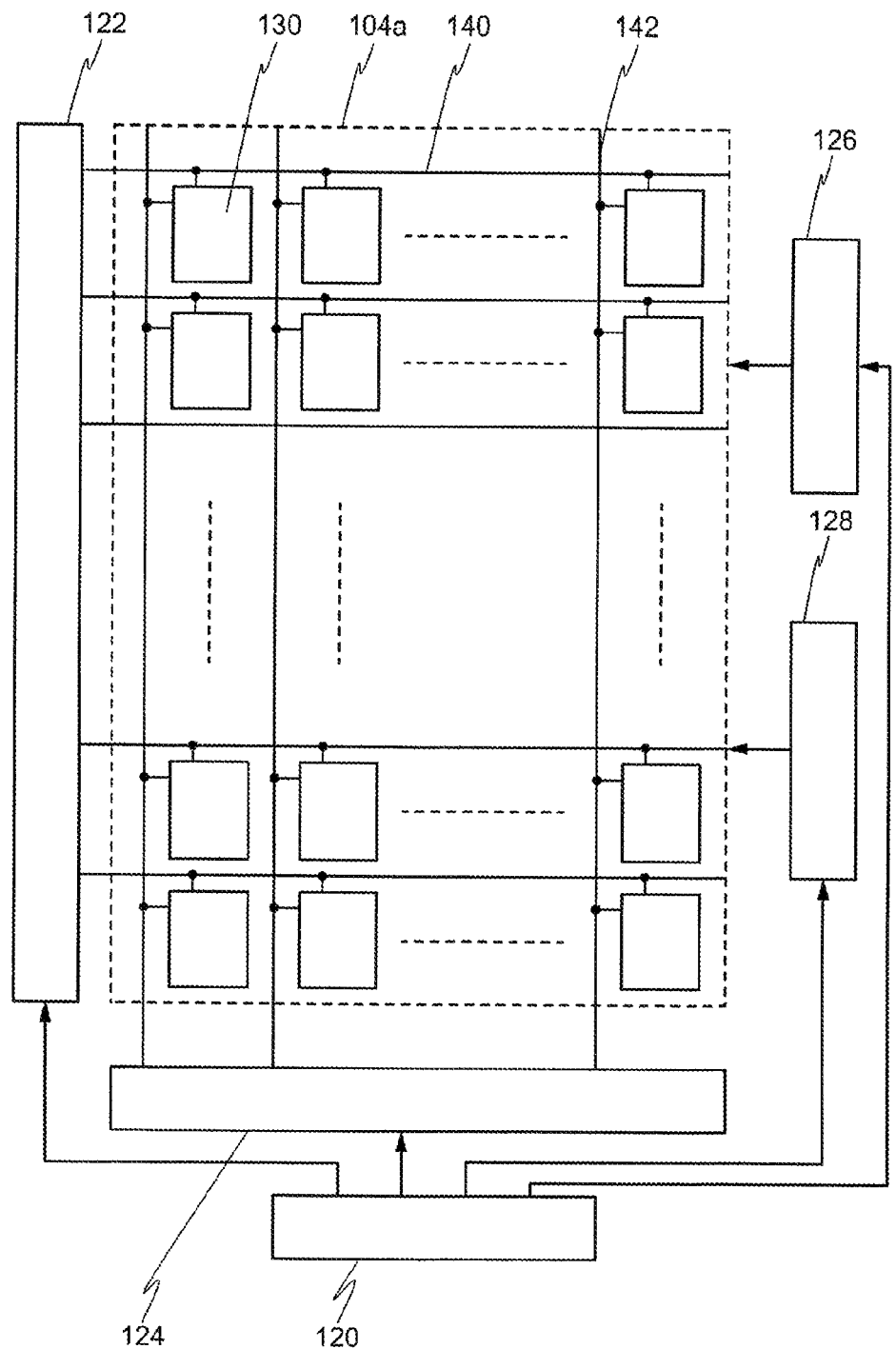
FIG. 2 is a circuit diagram illustrating a circuit configuration of a display device according to an embodiment of the present invention.
Figure 3:
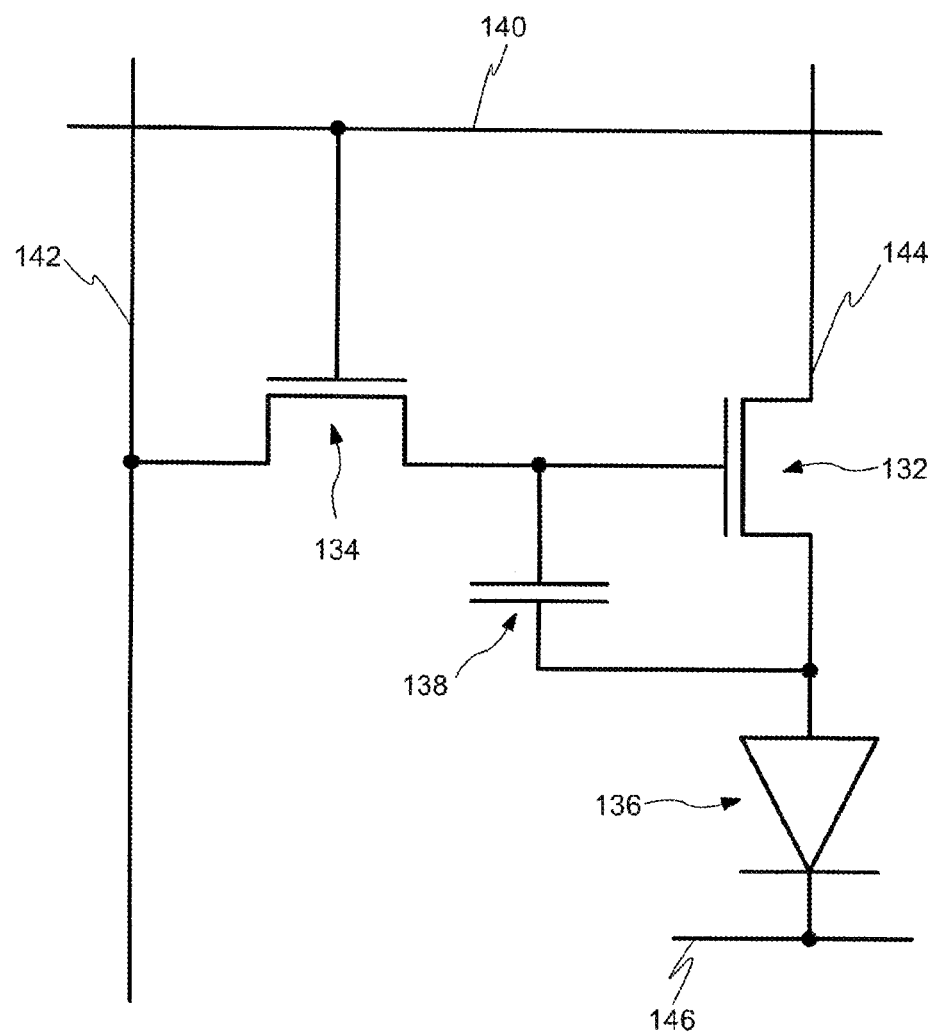
FIG. 3 is a circuit diagram illustrating a circuit configuration of a pixel circuit of a pixel of a display device according to an embodiment of the present invention.

FIG. 2 is a circuit diagram illustrating a circuit configuration of the display device 100 according to the first embodiment. FIG. 3 is a circuit diagram illustrating a circuit configuration of the pixel circuit 130 of each of the plurality of pixels 110 of the display device 100 according to the first embodiment.

The display device 100 according to the first embodiment includes a peripheral circuit, a plurality of pixel circuits 130, a plurality of scanning signal lines 140, and a plurality of video signal lines 142.

The peripheral circuit drives the pixel circuit 130 of each of the plurality of pixels 110 and controls how the plurality of pixels 110 emit light. The peripheral circuit includes a control circuit 120, a scanning line driving circuit 122, a video line driving circuit 124, a drive power circuit 126, and a reference power circuit 128.

It should be noted that the peripheral circuit includes transistors whose semiconductor layers contain a second semiconductor. A specific material for the second semiconductor will be described later.

The control circuit 120 controls how the scanning line driving circuit 122, the video line driving circuit 124, the drive power circuit 126, and the reference power circuit 128 operate.

The scanning line driving circuit 122 is connected to the plurality of scanning signal lines 140. The plurality of scanning signal lines 140 are provided for each separate horizontal arrangement (pixel row) of the plurality of pixels 110. The scanning line driving circuit 122 selects the plurality of scanning signal lines 140 in sequence in accordance with timing signals that are inputted from the control circuit 120.

The video line driving circuit 124 is connected to the plurality of video signal lines 142. The plurality of video signal lines 124 are provided for each separate vertical arrangement (pixel column) of the plurality of pixels 110. The video line driving circuit 124 receives video signals from the control circuit 120, and as the scanning line driving circuit 122 selects the scanning signal lines 140, the video line driving circuit 124 causes a voltage corresponding to a video signal of a selected pixel row to be written through the plurality of video signal lines 142.

The drive power circuit 126 is connected to drive power lines 144 provided for each separate pixel column. The drive power circuit 126 supplies a current that causes the pixels 110 of a selected pixel row to emit light.

The reference power circuit 128 is connected to a reference power line 146 provided in common for the plurality of pixels 110. The reference power circuit 128 applies a constant potential to a common electrode that constitutes the cathode electrodes of the light-emitting elements 136.

The following describes a circuit configuration of each of the plurality of pixel circuits 130 with reference to FIG. 3. It should be noted that the circuit configuration of the pixel circuit 130 described below is an example and is not limited to this.

Each of the plurality of pixel circuits 130 includes at least a driving transistor 132, a selecting transistor 134, a light-emitting element 136, and a retention capacitor 138.

The driving transistor 132 is a transistor that is connected to the light-emitting element 136 and controls the emission luminance of the light-emitting element 136. The driving transistor 132 has its drain current controlled by a gate-source voltage. The driving transistor 132 has its gate connected to the drain of the selecting transistor 134, its source connected to a drive power line 144, and its drain connected to the anode of the light-emitting element 136. The driving transistor 132 has a semiconductor layer 132d containing a first semiconductor. A specific material for the first semiconductor will be described later.

The selecting transistor 134 is a transistor that controls the conduction state between a video signal line 142 and the gate of the driving transistor 132 by on-off control action. The selecting transistor 134 has its gate connected to a scanning signal line 140, its source connected to the video signal line 142, and its drain connected to the gate of the driving transistor 132. The selecting transistor 134 has a semiconductor layer 134d containing the same first semiconductor as the driving transistor 132. The specific material for the first semiconductor will be described later.

That is, in the first embodiment, the semiconductor (second semiconductor) of the transistors that constitute the peripheral circuit and the semiconductor (first semiconductor) of the selecting transistor 134 and the driving transistor 132 are different materials.

The light-emitting element 136 has its anode connected to the drain of the driving transistor 132 and its cathode connected to a reference power line 146.

The retention capacitor 138 is connected between the gate and drain of the driving transistor 132. The retention capacitor 138 retains the gate-drain voltage of the driving transistor 132.

The foregoing has described the circuit configuration of the peripheral circuit of the display device 100 according to the first embodiment and the circuit configuration of the pixel circuit 130 of each of the plurality of pixels 110. The required characteristics of the transistors that constitute the peripheral circuit and of the driving transistor 132 and the selecting transistor 134, which constitute the pixel circuit 130, are described here. Furthermore, the specific materials for the first and second semiconductors are described. The transistors that constitute the peripheral circuit and the driving transistor 132 and the selecting transistor 134, which constitute the pixel circuit 130, are required to have different characteristics.

Because of constraints pertaining to the width of a frame (bezel) of a display device and constraints pertaining power consumption and the like, it is preferable that the transistors of the peripheral circuit be high in carrier mobility and able to form CMOS. Accordingly, the first embodiment uses polycrystalline silicon as the second semiconductor of the transistors that constitute the peripheral circuit.

The driving transistor 132 operates in a saturated state. It is therefore preferable that the driving transistor 132 have saturation characteristics that vary narrowly in on-state. Furthermore, it is desirable that the driving transistor 132 have a certain or greater channel length. This is because variations attributed to a so-called channel effect become obvious if the channel length of the driving transistor 132 is too short.

It is therefore preferable that the first semiconductor of the driving transistor 132 be a semiconductor that can minimize variations in on-state. The first embodiment uses an oxide semiconductor as the first semiconductor. While use of polycrystalline silicon as the first semiconductor may cause variations attributed to laser irradiation in ELA (excimer laser anneal), the use of an oxide semiconductor as the first semiconductor makes it possible to avoid such a problem.

It is desirable that the selecting transistor 134 have satisfactory switching characteristics. That is, it is preferable that the selecting transistor 134 be large in current value in an on-state and small in current value in an off-state.

It is therefore preferable that the first semiconductor of the selecting transistor 134 be a material that can minimize a leak current in an off-state of the selecting transistor 134. As mentioned above, the first embodiment uses an oxide semiconductor as the first semiconductor. A transistor using an oxide semiconductor is known to be sufficiently smaller in leak current in an off-state than a transistor using a silicon semiconductor.

This allows the selecting transistor 134 to reduce the leak current in an off-state. For this reason, as can be seen from the pixel circuit 130 shown in FIG. 3, charges accumulated in the retention capacitor 138 can be prevented from becoming lost due to a source-drain leak current even in an off-state of the selecting transistor 134.

The following describes in detail a configuration of each of the plurality of pixels 110 of the display device 100 according to the first embodiment with reference to the drawings.

[Configuration of Pixel]

Figure 4:
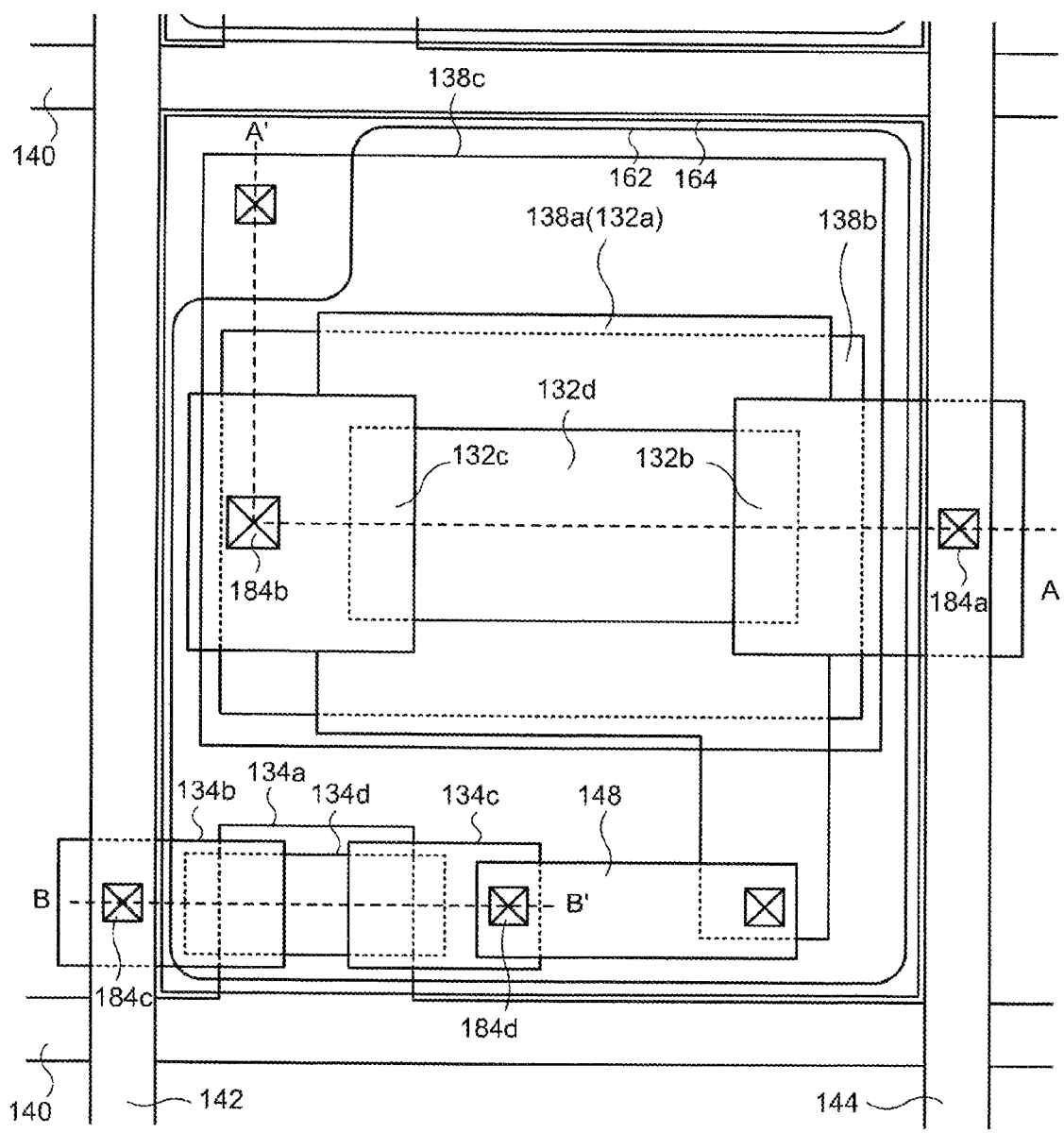
FIG. 4 is a plan view illustrating a configuration of a pixel of a display device according to an embodiment of the present invention.
Figure 5:
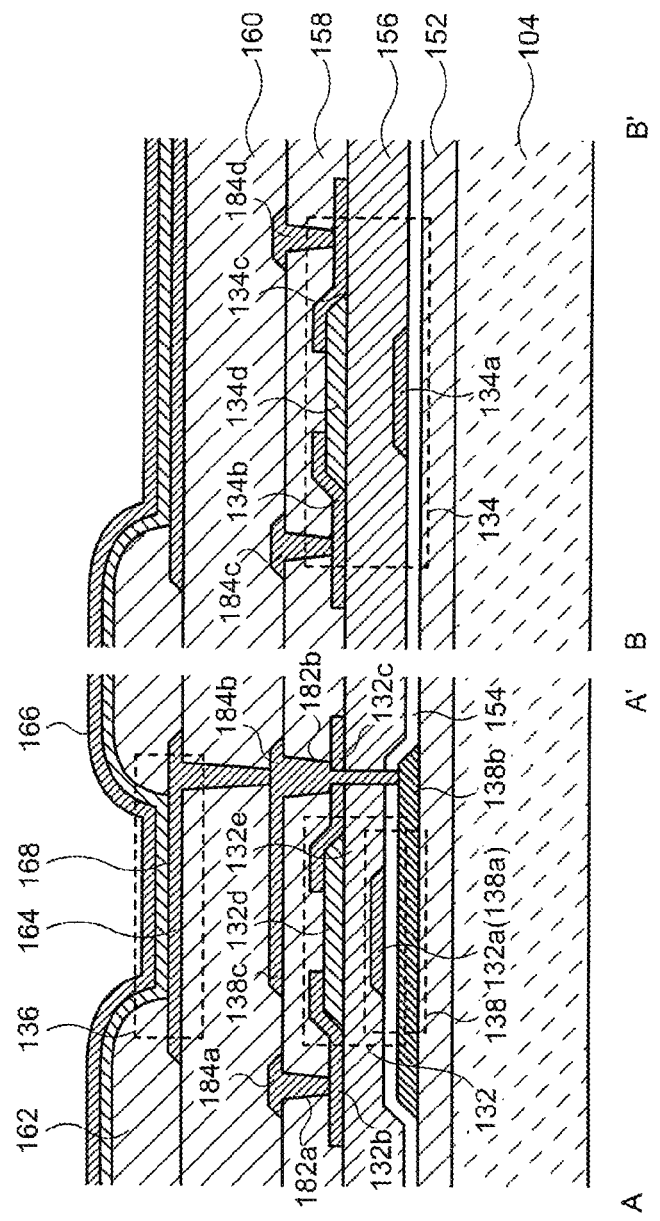
FIG. 5 is a cross-sectional view illustrating a configuration of a pixel of a display device according to an embodiment of the present invention.

FIG. 4 is a plan view illustrating a configuration of a pixel 110 of the display device 100 according to the first embodiment. FIG. 5 is a cross-sectional view illustrating a configuration of the pixel 110 of the display device 100 according to the first embodiment. FIG. 5 shows cross-sections taken along lines A-A' and B-B', respectively, of FIG. 4.

The display device 100 according to the first embodiment includes the first substrate 104 and the plurality of pixels 110.

On the surface of the first substrate 104, the display area 104a, the terminal area 104b, and the peripheral circuit area 104c are disposed. Examples of the material of which the first substrate 104 can be made are the same as those named above.

The plurality of pixels 110 are arranged on the surface of the first substrate 104. The display area 104a is an area where the plurality of pixels 110 are arranged. Each of the plurality of pixels 110 includes at least a light-emitting element 136, a driving transistor 132, a selecting transistor 134, a retention capacitor 138, a first contact electrode 184a, and a second contact electrode 184b.

The retention capacitor 138 is disposed over a first insulating layer 152. The first insulating layer 152 is disposed on one surface of the first substrate 104 so as to extend across at least the display area 104a. The first insulating layer 152 prevents foreign matter such as impurities contained in the first substrate 104 from entering any of the plurality of pixels 110. The first insulating layer 152 can be made of a material such as an inorganic insulating material. Usable examples of the inorganic insulating material include silicon oxide, silicon nitride, and the like. Alternatively, the inorganic insulating material may have a laminated structure of a combination of these materials.

The retention capacitor 138 has a first electrode 138a and a second electrode 138b. The first electrode 138a doubles as a gate 132a of the driving transistor 132. The second electrode 138b is disposed at a lower layer than the first electrode 138a. The second electrode 138b is made of a material including the second semiconductor. In the first embodiment, as mentioned above, the second semiconductor is polycrystalline silicon. Since the second semiconductor serves as one electrode of a capacitor, it is preferable that the second semiconductor be high in both carrier mobility and carrier density. In the first embodiment, the second electrode 138b is one obtained by implanting a high concentration of impurities such as phosphorus (P) into polycrystalline silicon and thereby imparting n-type conductivity. In the following description, the second semiconductor may sometimes be referred to as "polycrystalline silicon".

The retention capacitor 138 is formed by the first electrode 138a and the second electrode 138b with a second insulating layer 154 sandwiched therebetween. In a layer structure, the second insulating layer 154 is sandwiched between the first electrode 138a and the second electrode 138b. Further, in a planar structure, the second insulating layer 154 is disposed across at least the display area 104a. The second insulating layer 154 may be made of the same material as the aforementioned first insulating layer 152.

The driving transistor 132 has a so-called bottom-gate structure in which a gate is disposed below a semiconductor layer with a gate insulating layer interposed therebetween. The semiconductor layer 132d of the driving transistor 132 contains the first semiconductor. In the first embodiment, as mentioned above, the first semiconductor is an oxide semiconductor. In the following description, the first semiconductor may sometimes be referred to as "oxide semiconductor". The gate 132a of the driving transistor 132 doubles as the first electrode 138a of the retention capacitor 138.

The gate insulating layer of the driving transistor 132 is a third insulating layer 156. In a layer structure, the third insulating layer 156 is disposed at a higher layer than the retention capacitor 138. Further, in a planar structure, the third insulating layer 156 is disposed across the display area 104a. The third insulating layer 156 functions as the gate insulating layers of the driving transistor 132 and the selecting transistor 134. The third insulating layer 156 may be made of the same material as the aforementioned first insulating layer 152.

As can be seen from FIG. 4, the driving transistor 132 has a channel region that, in a plan view, has an area overlapping the second electrode 138b. The term "channel region" here means a region at the interface between a semiconductor layer and a gate insulating layer where carriers are accumulated and a channel is formed. In the first embodiment, the channel region of the driving transistor 132 wholly overlaps the second electrode 138b in a plan view.

That is, the driving transistor 132 and the retention capacitor 138 are disposed at different layers in a layer structure and disposed in overlapping areas in a plan view. Having such a configuration makes it possible to reduce the amount of space that is occupied by elements disposed within one pixel. This makes it possible to reduce the size of one pixel, allowing the display device 100 to be high in definition.

Further, as can be seen from FIG. 4, the gate 132a of the driving transistor 132 is connected to a jumper wire 148. The jumper wire 148 is disposed over a fourth insulating layer 158 so as to connect the gate 132a of the driving transistor 132 to a drain 134c of the selecting transistor 134. The driving transistor 132 has its source 132b connected to a drive power line 144. The drive power line 144 is disposed over the fourth insulating layer 158. The driving transistor 132 has its drain 132c connected to a pixel electrode 164. The pixel electrode 164 is disposed over a planarizing insulating layer 160.

The selecting transistor 134 has a so-called bottom-gate structure in which a gate is disposed below a semiconductor layer with a gate insulating layer interposed therebetween. The semiconductor layer 134d of the selecting transistor 134 contains the first semiconductor (oxide semiconductor) and is disposed at the same layer as the semiconductor layer 132d of the driving transistor 132. In a manufacturing step, the semiconductor layer 134d of the selecting transistor 134 and the semiconductor layer 132d of the driving transistor 132 may be simultaneously formed by the same photolithography step.

Furthermore, the selecting transistor 134 has its gate 134a disposed at the same layer as the gate 132a of the driving transistor 132. That is, the gate 134a of the selecting transistor 134 can also be said to be disposed at the same layer as the first electrode 138a of the retention capacitor 138.

As can be seen from FIG. 4, the gate 134a of the selecting transistor 134 extends from a scanning signal line 140. The scanning signal line 140 is disposed over the second insulating layer 154. That is, the scanning signal line 140 doubles as the gate 134a of the selecting transistor 134. The selecting transistor 134 has its source 134b connected to a video signal line 142. The video signal line 142 is disposed over the fourth insulating layer 158. The selecting transistor 134 has its drain 134c connected to the jumper wire 148. The jumper wire 148 is disposed over the fourth insulating layer 158 so as to connect the gate 132a of the driving transistor 132 to the drain 134c of the selecting transistor 134. In a layer structure, the fourth insulating layer 158 is disposed at a higher layer than the driving transistor 132 and the selecting transistor 134. Further, in a planar structure, the fourth insulating layer 158 is disposed across the display area 104a. The fourth insulating layer 158 may be made of the same material as the aforementioned first insulating layer 152.

The first contact electrode 184a is provided in a first contact hole 182a extending from a higher layer than the driving transistor 132 to the source 132b of the driving transistor 132. The first contact hole 182a is provided in a place overlapping the source 132b of the driving transistor 132 in a plan view and is bored through the fourth insulating layer 158. The first contact electrode 184a is connected to the source 132b of the driving transistor 132. This allows the driving transistor 132 to have its source 132b connected to the drive power line 144.

The second contact electrode 184b is provided in a second contact hole 182b extending from a higher layer than the driving transistor 132 to the second electrode 138b. The second contact hole 182b is provided in a place overlapping the drain 132c of the driving transistor 132 in a plan view and is bored through the fourth insulating layer 158, the drain 132c of the driving transistor 132, the third insulating layer 156, and the second insulating layer 154. This allows the second contact electrode 184b to be connected to the drain 132c of the driving transistor 132 and the second electrode 138b. This allows the drain 132c of the driving transistor 132 and the second electrode 138b of the retention capacitor 138 to be connected to each other. Note here that the second contact electrode 184b makes contact not only with a side wall of an aperture bored through the drain 132c but also with a surface of the drain 132c around an edge of the aperture. This makes it possible to prevent a bad electrical connection between the drain 132c of the driving transistor 132 and the second contact electrode 184b.

Note here that although the first contact hole 182a and the second contact hole 182b differ in depth from each other, they can be simultaneously formed by the same photolithography step. In forming the drain 132c of the driving transistor 132 in a photolithography step, it is only necessary to form an aperture in advance in the place where the second contact hole 182b is to be formed. Alternatively, in forming the drain 132c of the driving transistor 132 in a photolithography step, it is only necessary to form the drain 132c so that its edge overlaps the place where the second contact hole 182b is to be formed. This allows the source 132b of the driving transistor 132 to serve as an etching stopper during the formation of the first contact hole 182a and allows the second electrode 138b of the retention capacitor 138 to serve as an etching stopper during the formation of the second contact hole 182b.

It should be noted that, over the fourth insulating layer 158, a third electrode 138c extends from the second contact electrode 184b. As shown in FIG. 4, the third electrode 138c has an area overlapping the second electrode 138b of the retention capacitor 138. In the first embodiment, in a plan view, the third electrode 138c covers an area occupied by the second electrode 138b. This allows a further capacitor to be formed by the third electrode 138c and the second electrode 138b.

The light-emitting element 136 is provided over the planarizing insulating layer 160. The light-emitting element 136 is a self-luminous light-emitting element. A usable example of the self-luminous light-emitting element is an organic EL light-emitting element. The organic EL light-emitting element includes a pixel electrode 164, a common electrode 166, and a light-emitting layer 168.

The pixel electrode 164 is disposed for each of the plurality of pixels 110. It is preferable that, in order to reflect light generated by the light-emitting layer 168 toward the common electrode 166, the pixel electrode 164 be made of a material including a high-reflectance metal layer. The high-reflectance metal layer can be made, for example, of silver (Ag).

Furthermore, a transparent conductive layer may be stacked in addition to the aforementioned high-reflectance metal layer. It is preferable that the transparent conductive layer be made, for example, of ITO (indium tin oxide), IZO (indium zinc oxide), or the like. Alternatively, the transparent conductive layer may be made of a combination thereof.

The common electrode 166 is disposed across the plurality of pixels 110. It is preferable that, in order to allow passage of light generated by the light-emitting layer 168, the common electrode 166 be made of a translucent and conductive material. It is preferable that the common electrode 166 be made of a material such as ITO (indium tin oxide) or IZO (indium zinc oxide). Alternatively, the common electrode 166 may be made of a metal layer having such a thickness as to allow passage of emitted light. It should be noted that, instead of being disposed to cover all the pixels as in the case of the first embodiment, the common electrode 166 may be divided into a plurality of blocks that are shared by the plurality of pixels 110 or may be provided independently for each pixel 110.

The light-emitting layer 168 is disposed to be sandwiched between the pixel electrode 164 and the common electrode 166. The light-emitting layer 168 is made of an organic EL material that emits light when supplied with a current. The organic EL material can be a low molecular or high molecular organic material. In a case where a low molecular organic material is used, the light-emitting layer 168 includes a hole injection layer, an electron injection layer, a hole transport layer, an electron transport layer, or the like in addition to the luminous organic material so that the luminous organic material is sandwiched.

The planarizing insulating layer 160 is disposed over the fourth insulating layer 158. The planarizing insulating layer 160 is provided to planarize asperities attributed to the various types of transistors, wires, and the like disposed at a lower layer. The planarizing insulating layer 160 can be made of an organic insulating material. Usable examples of the organic insulating material include acrylic resin, polyimide resin, and the like.

A bank 162 is provided between two adjacent pixels 110. The bank 162 is provided so as to cover the outer edge of the pixel electrode 164. Furthermore, the bank 162 is provided so as to cover a connection between the drain 132*c* of the driving transistor 132 and the pixel electrode 164.

It is preferable that the bank 162 be made of an insulating material. The insulating material can be an inorganic insulating material or an organic insulating material. Usable examples of the inorganic insulating material include silicon oxide, silicon nitride, a combination thereof, and the like. Usable examples of the organic insulating material include polyimide resin, acrylic resin, a combination thereof, and the like. A combination of the inorganic insulating material and the organic insulating material may be used.

The disposition of the bank 162 formed by an insulating material makes it possible to prevent the common electrode 166 and the pixel electrode 164 from being short-circuited at an edge of the pixel electrode 164. Furthermore, adjacent pixels 110 can be surely insulated from each other.

[Manufacturing Method]

FIGS. 6A to 6O are plan views illustrating a method for manufacturing a display device 100 according to the first embodiment. These drawings show cross-sections taken along lines A-A' and B-B' of FIG. 4.

The first insulating layer 152 is formed over the first substrate 104 first, and then a polycrystalline silicon layer 171 is formed over the first insulating layer 152 (FIG. 6A).

The first insulating layer 152 can be made of a material such as an inorganic insulating material. Usable examples of the inorganic insulating material include silicon oxide, silicon nitride, and the like. Alternatively, the inorganic insulating material may have a laminated structure of a combination of these materials. The first insulating layer 152 can be formed by a method such as a CVD method.

The polycrystalline silicon layer 171 is formed by forming an amorphous silicon layer by a CVD method first and then polycrystallizing the amorphous silicon layer by heat treatment and an ELA (excimer laser anneal) method.

Next, the polycrystalline silicon layer 171 is patterned by a photolithography step to form an island-shaped polycrystalline silicon layer 172 (FIG. 6B). In this step, a layer that becomes the second electrode 138*b* of the retention capacitor 138 and the semiconductor layers of the transistors of the peripheral circuit (not illustrated) are simultaneously formed.

Next, the polycrystalline silicon layer 172 is subjected to an ion implantation process a required number of times (FIG. 6C). An n-type region is formed by implanting impurities such as phosphorus (P), and a p-type region is formed by implanting impurities such as boron (B). In FIG. 6C, which shows the second electrode 138*b* of the retention capacitor 138, n-type conductivity is imparted by implanting a high concentration of impurities such as phosphorus (P) into the polycrystalline silicon layer 172. This allows the second electrode 138*b* of the retention capacitor 138 to be formed.

It should be noted that although the foregoing steps have shown an example in which ion implantation follows the patterning of the polycrystalline silicon layer 172, the order is not limited to this but may be reversed.

Figure 6D:
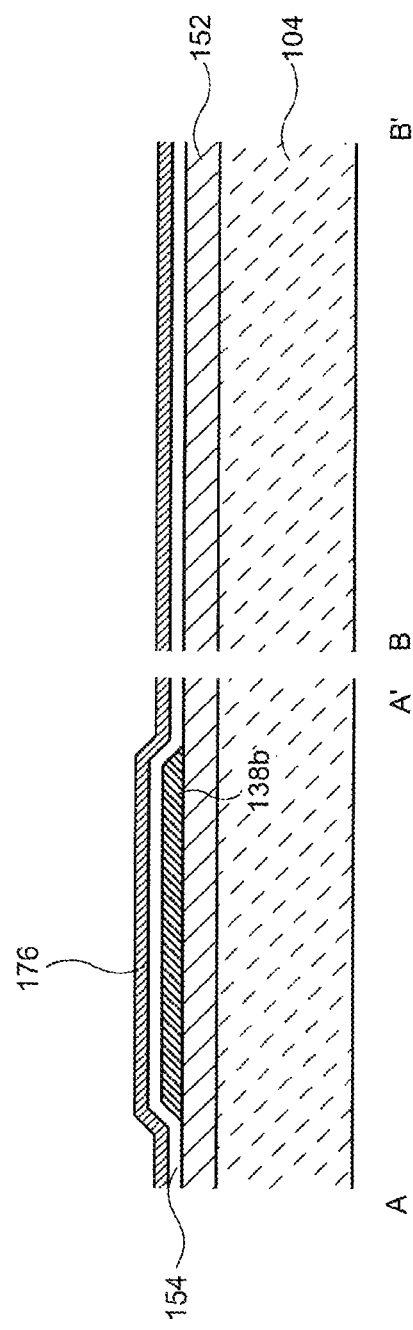
FIG. 6D is a cross-sectional view illustrating a method for manufacturing a display device according to an embodiment of the present invention.

Next, the second insulating layer 154 is formed, and a first metal layer 176 is formed over the second insulating layer 154 (FIG. 6D). The second insulating layer 154 is an insulating layer that constitutes the retention capacitor 138. The second insulating layer 154 can be made of an inorganic insulating material. Usable examples of the inorganic insulating material include silicon oxide, silicon nitride, and the like. The second insulating layer 154 can be formed by a method such as a CVD method.

The first metal layer 176 can be made, for example, of W, MoW, Mo/Al/Mo, Ti/Al/Ti, or the like. The first metal layer 176 can be formed by a method such as a sputtering method.

Figure 6E:
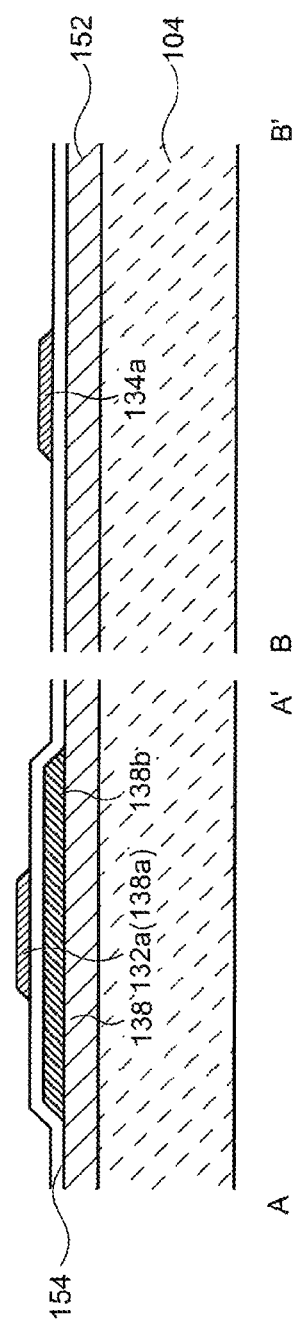
FIG. 6E is a cross-sectional view illustrating a method for manufacturing a display device according to an embodiment of the present invention.

Next, the first meal layer 176 is patterned by a photolithography step (FIG. 6E). A method of etching can be either dry etching or wet etching. This step allows the gate 132*a* of the driving transistor 132, which doubles as the first electrode 138*a* of the retention capacitor 138, the gate 134*a* of the selecting transistor 134, and the scanning signal line 140 to be formed.

Next, the third insulating layer 156 is formed, and a first semiconductor layer (oxide semiconductor layer) 174 is formed over the third insulating layer 156 (FIG. 6F). The third insulating layer 156 is an insulating layer that constitutes the gate insulating layers of the driving transistor 132 and the selecting transistor 134. The third insulating layer 156 can be made of an inorganic insulating material. Usable examples of the inorganic insulating material include silicon oxide, silicon nitride, and the like. The third insulating layer 156 can be formed by a method such as a CVD method.

The oxide semiconductor layer 174 can be formed by a method such as a sputtering method. In the formation of a film by a sputtering method, a substrate is heated during film formation, and a mixed gas $Ar/O_2$ is utilized and has a gas ratio of $Ar<O_2$. A power source used for sputtering may be a DC power source or an RF power source, and can be chosen according to conditions of formation of a sputtering target. For example when the sputtering target is InGaZnO, it can have a composition ratio In:Ga:Zn:O of 1:1:1:4 ($In_2O_3$:$Ga_2O_3$:ZnO of 1:1:2) or the like, and the composition ratio may vary according to purposes (such as transistor characteristics).

An annealing process may be performed for film quality improvement such as dehydrogenation and density improvement from the oxide semiconductor layer 174. Annealing conditions can be determined by setting the atmosphere (vacuum, nitrogen, dry air, or air), the temperature (250 to 500° C.), and the duration (15 minutes to 1 hour) according to purposes.

Next, the oxide semiconductor layer 174 is patterned by a photolithography step (FIG. 6G), whereby the semiconductor layer 132d of the driving transistor 132 and the semiconductor layer 134d of the selecting transistor 134 are simultaneously formed.

It should be noted that although the first embodiment has shown an example in which annealing precedes the patterning of the oxide semiconductor layer 174, this does not imply any limitation and annealing may precede or follow patterning. It should also be noted that in a case where the temperature is high, it is preferable that annealing precedes patterning so that a shift in pattern of the oxide semiconductor layer 174 due to shrinkage is prevented.

Figure 6H:
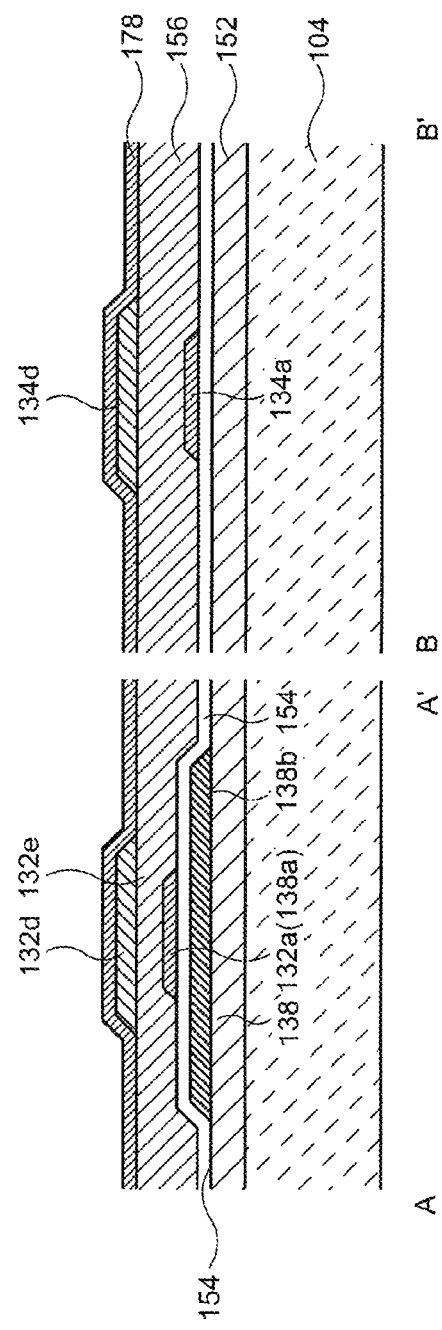
FIG. 6H is a cross-sectional view illustrating a method for manufacturing a display device according to an embodiment of the present invention.

Next, a second metal layer 178 is formed (FIG. 6H). The second metal layer 178 can be made, for example, of W, MoW, Mo/Al/Mo, Ti/Al/Ti, or the like. The second metal layer 178 can be formed by a method such as a sputtering method.

Figure 6I:
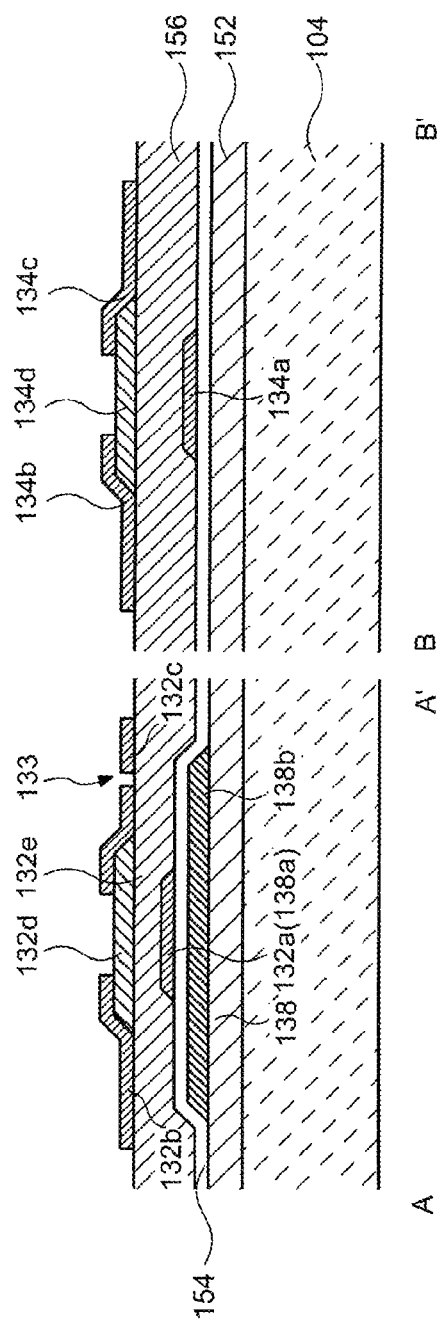
FIG. 6I is a cross-sectional view illustrating a method for manufacturing a display device according to an embodiment of the present invention.

Next, the second meal layer 178 is patterned by a photolithography step (FIG. 6I). A method of etching can be either dry etching or wet etching. This step allows the source 132b and drain 132c of the driving transistor 132 and the source 134b and drain 134c of the selecting transistor 134 to be formed.

Note here that at least one aperture 133 is formed in the drain 132c of the driving transistor 132 so that, in the subsequent step of forming contact holes, the first contact hole 182a, which extends to the source 132b of the driving transistor 132, and the second contact hole 182b, which is bored through the drain 132c of the driving transistor 132 and extends to the second electrode 138b, are simultaneously formed.

Figure 6J:
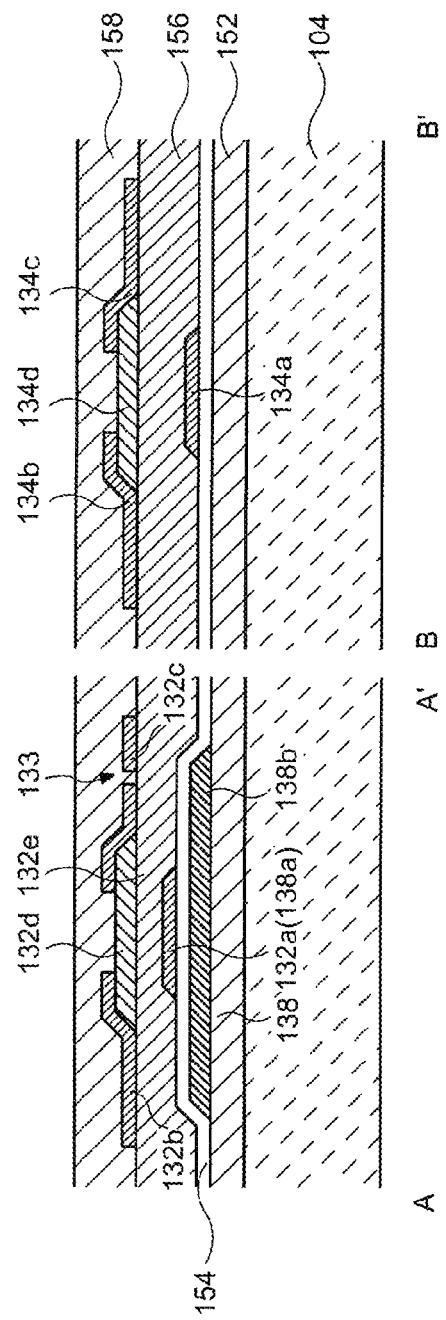
FIG. 6J is a cross-sectional view illustrating a method for manufacturing a display device according to an embodiment of the present invention.

Next, the fourth insulating layer 158 is formed (FIG. 6J). The fourth insulating layer 158 can be made of an inorganic insulating material. Usable examples of the inorganic insulating material include silicon oxide, silicon nitride, and the like. The fourth insulating layer 158 can be formed by a method such as a CVD method.

Next, a plurality of contact holes are formed by a photolithography step, starting from the fourth insulating layer 158 (FIG. 6K). In the first embodiment, the first contact hole 182a, which extends to the source 132b of the driving transistor 132, the second contact hole 182b, which is bored through the drain 132c of the driving transistor 132 and extends to the second electrode 138b, a third contact hole 182c that extends to the source 134b of the selecting transistor 134, and a fourth contact hole 182d that extends to the drain 134c of the selecting transistor 134 are simultaneously formed. The second contact hole 182b is provided in a place overlapping the aperture 133 provided in advance in the drain 132c of the driving transistor 132. This allows the source 132b of the driving transistor 132, the second electrode 138b of the retention capacitor 138, the source 134b of the selecting transistor 134, the drain 134c of the selecting transistor 134 to serve as etching stoppers for the first contact hole 182a, the second contact hole 182b, the third contact hole 182c, and the fourth contact hole 182d, respectively, so that these contact holes differing in depth can be simultaneously formed.

At this point in time, the second contact hole 182b is formed so as to have an area overlapping the aperture 133 in a plan view. Furthermore, at this point in time, it is preferable that the second contact hole 182b be formed to be larger than the contour of the aperture 133 in a plan view. In other words, it is preferable that the second contact hole 182b be larger in area than the aperture 133 in a plan view.

This causes a surface of the drain 132c around an edge of the aperture 133 and a side wall of the aperture 133 to be exposed at the drain 132c of the driving transistor 132. With this, in the subsequent step of forming contact electrodes, the second contact electrode 184b, which fills the second contact hole 182b, makes contact with the drain 132c not only by the side wall of the aperture 133 but also by the surface of the drain 132c around the edge of the aperture 133. This makes it possible to prevent a bad electrical connection between the drain 132c of the driving transistor 132 and the second contact electrode 184b.

Figure 6L:
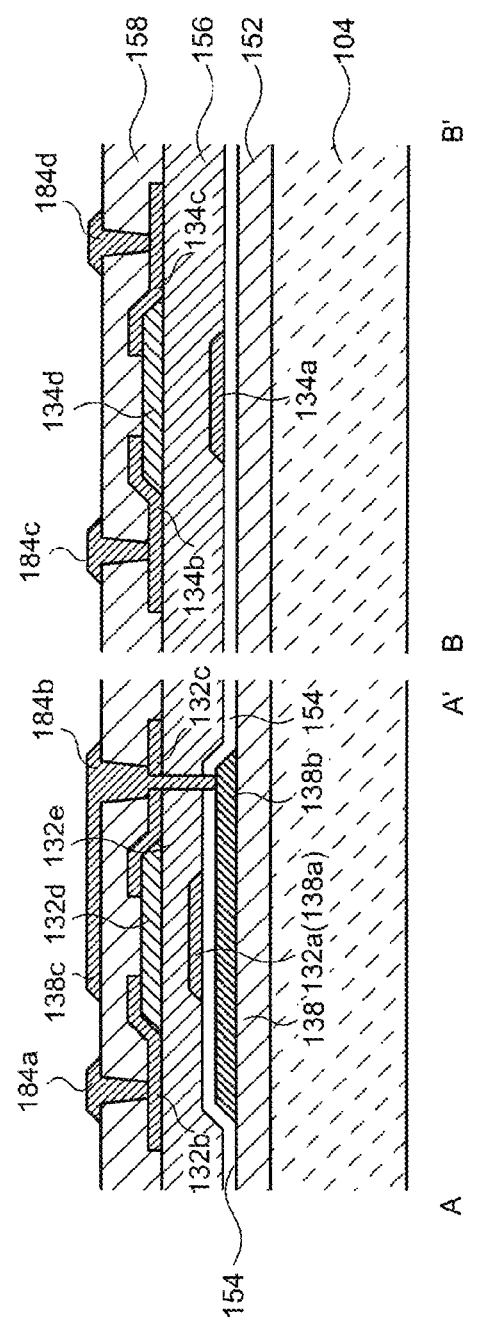
FIG. 6L is a cross-sectional view illustrating a method for manufacturing a display device according to an embodiment of the present invention.
Figure 60:
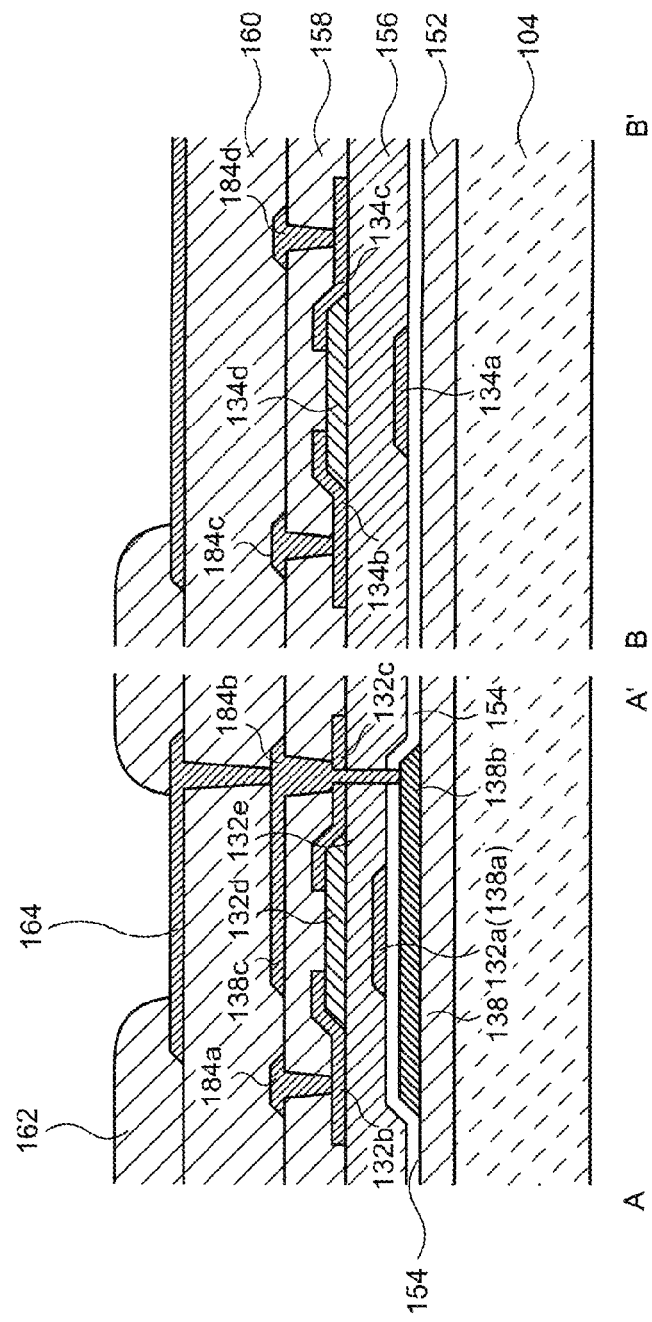

Next, a third metal layer is formed, and the third metal layer is patterned by a photolithography step (FIG. 6L). The third metal layer can be made, for example, of W, MoW, Mo/Al/Mo, Ti/Al/Ti, or the like. The third metal layer can be formed by a method such as a sputtering method. A method of etching can be either dry etching or wet etching. This step allows the video signal line 142, the drive power line 144, and the jumper wire 148 to be formed, and also allows the first contact electrode 184a, the second contact electrode 184b, a third contact electrode 184c, and a fourth contact electrode 184d to be formed.

Note here that the second contact electrode 184b connects the drain 132c of the driving transistor 132 and the second electrode 138b of the retention capacitor 138 to each other. As mentioned above, the second contact electrode 184b makes contact with the drain 132c not only by the side wall of the aperture 133 but also by the surface of the drain 132c around the edge of the aperture 133. This makes it possible to prevent a bad electrical connection between the drain 132c of the driving transistor 132 and the second contact electrode 184b.

Next, the planarizing insulating layer 160 is formed over the various types of wires, and desired contact apertures are formed (FIG. 6M). The planarizing insulating layer 160 is provided to planarize asperities attributed to the various types of transistors, wires, and the like disposed at a lower layer. The planarizing insulating layer 160 can be made of an organic insulating material. Usable examples of the organic insulating material include acrylic resin, polyimide resin, and the like. The planarizing insulating layer 160 can be formed by a method such as a coating method.

Next, the pixel electrode 164 is formed over the planarizing insulating layer 160 (FIG. 6N). As mentioned above, it is preferable that the pixel electrode 164 be made of a material including a high-reflectance metal layer made of silver (Ag) or the like. Furthermore, a transparent conductive layer made of ITO (indium tin oxide), IZO (indium zinc oxide), or the like may be stacked.

Next, the bank 162 is formed between two adjacent pixels 110 (FIG. 6O). The bank 162 is provided so as to cover the outer edge of the pixel electrode 164. It is preferable that the bank 162 be made of an insulating material. As mentioned above, the insulating material can be an inorganic insulating material or an organic insulating material.

Next, the light-emitting layer 168 is formed so as to cover the pixel electrode 164 and the bank 162, and the common electrode 166, which covers the plurality of pixels 110 within the display area 104a, is formed, whereby the array substrate 102 shown in FIG. 5 is completed. The light-emitting layer 168 can be formed by a method such as an evaporation method. The common electrode 166 can be formed by a method such as a sputtering method.

The foregoing has described the configuration of and the method for manufacturing the display device 100 according to the first embodiment. The display device 100 according to the first embodiment can satisfy constraint conditions pertaining to the width of the frame (bezel), power consumption, and the like of the display device by using polycrystalline silicon in the transistors that constitute the peripheral circuit. Further, the use of an oxide semiconductor in the driving transistor 132, which constitutes the pixel circuit 130, makes it possible to reduce variations in the amount of light that are emitted by the pixels 110. Further, the use of an oxide semiconductor in the selecting transistor 134, which constitutes the pixel circuit 130, makes it possible to prevent charges accumulated in the retention capacitor 138 from becoming lost due to a source-drain leak current. Furthermore, the overlapping disposition of the driving transistor 132 and the retention capacitor 138 in a plan view makes it possible to reduce the size of the pixels 110, allowing the display device 100 to be high in definition.

Second Embodiment

A configuration of a display device 200 (FIG. 8) according to a second embodiment is described with reference to the drawings. It should be noted that the following description may omit invention-specifying matters that are common to the display device 100 according to the first embodiment and the display device 200 according to the second embodiment and focuses on the differences between them.

The display device 200 according to the second embodiment differs from the display device 100 according to the first embodiment in the configuration of the selecting transistor 134 of each of the plurality of pixels 110. Specifically, the semiconductor layer 134d of the selecting transistor 134 contains the second semiconductor.

As mentioned above, it is desirable that the selecting transistor 134 have satisfactory switching characteristics. That is, it is preferable that the selecting transistor 134 be large in current value in an on-state and small in current value in an off-state.

In a case where attention is focused on achieving a large current value in an on-state, it is preferable that the second semiconductor of the selecting transistor 134 be a material that is high in carrier mobility. As described in the first embodiment, the second semiconductor is polycrystalline silicon.

This allows the selecting transistor 134 to supply a sufficiently large current in an on-state. For this reason, as can be seen from the pixel circuit 130 shown in FIG. 3, an increase in resistance between the video signal line 142 and the gate 132a of the driving transistor 132 can be suppressed in an on-state of the selecting transistor 134.

Figure 7:
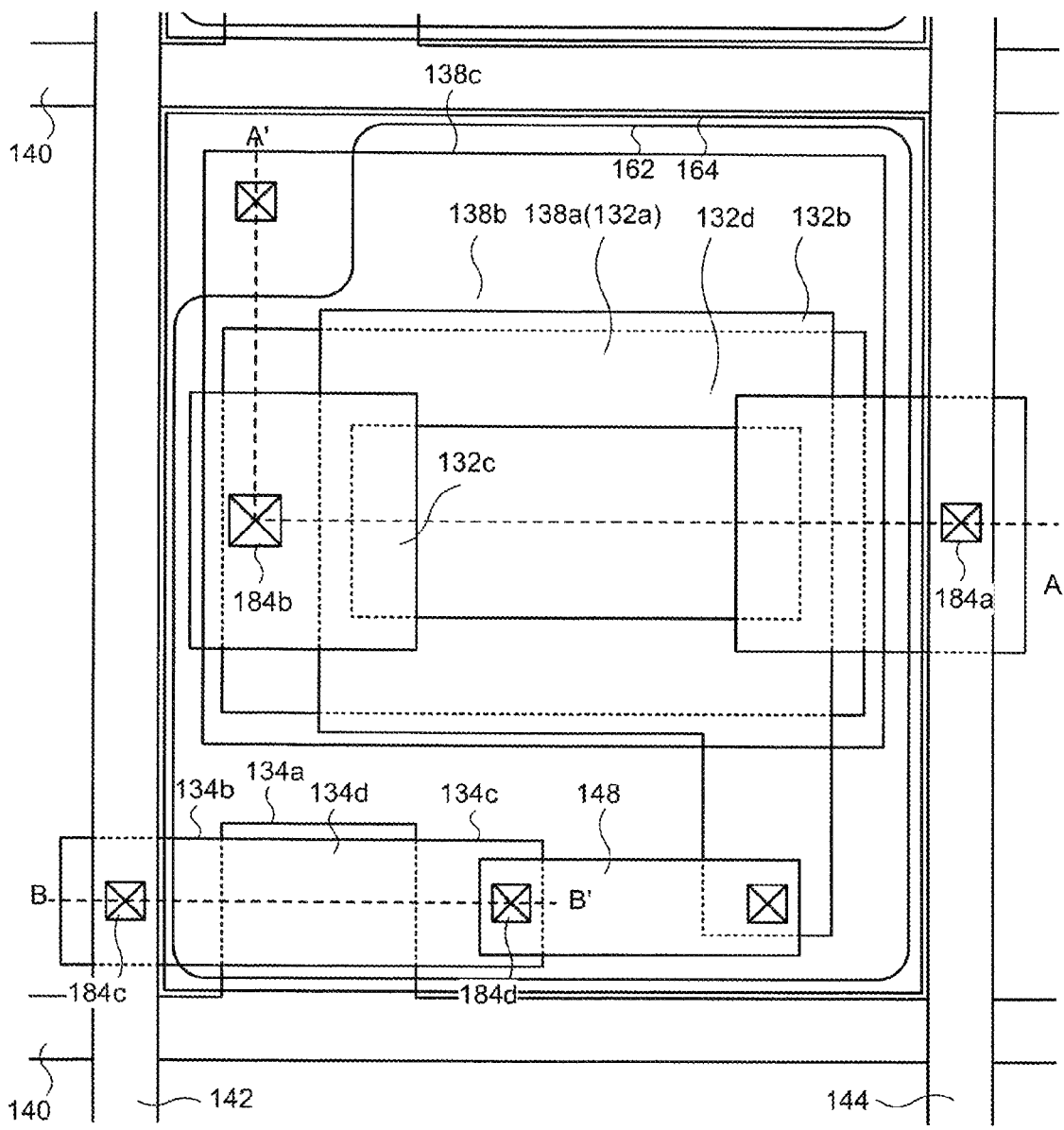
FIG. 7 is a plan view illustrating a configuration of a pixel of a display device according to an embodiment of the present invention.

FIG. 7 is a plan view illustrating a configuration of a pixel 110 of the display device 200 according to the second embodiment. FIG. 8 is a cross-sectional view illustrating a configuration of the pixel 110 of the display device 200 according to the second embodiment. FIG. 8 shows cross-sections taken along lines A-A' and B-B' of FIG. 7.

The selecting transistor 134 has a so-called top-gate structure in which a gate is disposed above a semiconductor layer with a gate insulating layer interposed therebetween. The semiconductor layer 134d, which functions as a channel region of the selecting transistor 134, contains the second semiconductor (polycrystalline silicon) and is disposed at the same layer as the second electrode 138b of the retention capacitor 138.

In the second embodiment, the selecting transistor 134 has a so-called staggered structure in which each of its electrodes, namely the gate 134a, the source 134b, and the drain 134c, is disposed above the polycrystalline silicon layer 172 (FIG. 9B). As such, as compared with the selecting transistor 134 of the display device 100 according to the first embodiment, which has an inversely-staggered structure, the selecting transistor 134 of the display device 200 according to the second embodiment is lower in parasitic capacitance and higher in speed of switching operation.

[Manufacturing Method]

FIGS. 9A to 9E are cross-sectional views illustrating a method for manufacturing a display device 200 according to the second embodiment. These drawings show cross-sections taken along lines A-A' and B-B' of FIG. 7.

The first insulating layer 152 is formed over the first substrate 104 first, and then the polycrystalline silicon layer 172 is formed over the first insulating layer 152 (FIG. 9A). The steps so far are the same as those of the method for manufacturing a display device 100 according to the first embodiment and, as such, are not described in detail here.

Next, the polycrystalline silicon layer 172 is patterned by a photolithography step (FIG. 9B). In this step, a layer that becomes the second electrode 138b of the retention capacitor 138, the semiconductor layer 134d of the selecting transistor 134, and the semiconductor layers of the transistors of the peripheral circuit (not illustrated) are simultaneously formed.

Next, the polycrystalline silicon layer 172 is subjected to an ion implantation process a required number of times (FIG. 9C). An n-type region is formed by implanting impurities such as phosphorus (P), and a p-type region is formed by implanting impurities such as boron (B). In FIG. 9C, which shows the second electrode 138b of the retention capacitor 138, n-type conductivity is imparted by implanting a high concentration of impurities such as phosphorus (P) into the polycrystalline silicon layer 172. Along with this, n-type conductivity is imparted by selectively implanting a high concentration of impurities such as phosphorus (P) into a region that becomes the source 134b and drain 134c of the selecting transistor 134. At this point in time, no impurities are added to the semiconductor layer 134d of the selecting transistor 134, so that it remains an intrinsic semiconductor.

The process from the next step to the formation of the source 132b and drain 132c of the driving transistor 132 and the source 134b and drain 134c of the selecting transistor 134 (FIG. 9D) is the same as that of the first embodiment and, as such, is not described here.

After the formation of the source 132b and drain 132c of the driving transistor 132 and the source 134b and drain 134c of the selecting transistor 134, the fourth insulating layer 158 is formed (FIG. 9E).

Figure 9D:
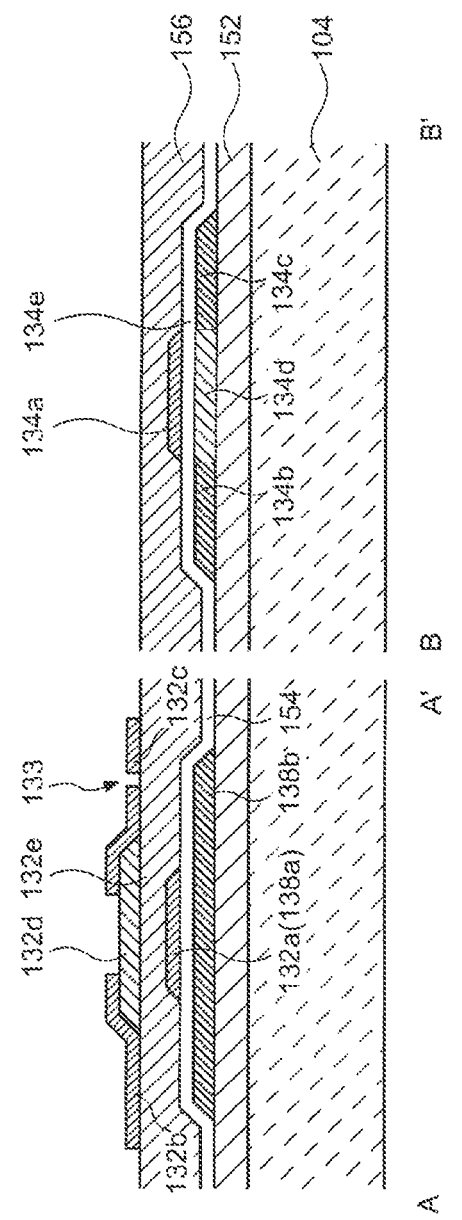
FIG. 9D is a cross-sectional view illustrating a method for manufacturing a display device according to an embodiment of the present invention.

The second embodiment differs from the first embodiment in the method for forming a plurality of contact holes after the formation of the fourth insulating layer 158. The second embodiment differs from the first embodiment in the layer to which the third contact hole 182c and the fourth contact hole 182d extend. In the second embodiment, etching is performed under such conditions that the third contact hole 182c and the fourth contact hole 182d both extend to the source 134b and drain 134c of the selecting transistor 134 (FIG. 9D). This allows the source 132b of the driving transistor 132 and the second electrode 138b to serve as etching stoppers for the first contact hole 182a and the second contact hole 182b, respectively, so that these contact holes differing in depth can be simultaneously formed.

At this point in time, as in the case of the first embodiment, the second contact hole 182b is formed so as to have an area overlapping the aperture 133 in a plan view. Furthermore, at this point in time, it is preferable that the second contact hole 182b be formed to be larger than the contour of the aperture 133 in a plan view. In other words, it is preferable that the second contact hole 182*b* be larger in area than the aperture 133 in a plan view.

This causes a surface of the drain 132*c* around an edge of the aperture 133 and a side wall of the aperture 133 to be exposed at the drain 132*c* of the driving transistor 132. With this, in the subsequent step of forming contact electrodes, the second contact electrode 184*b*, which fills the second contact hole 182*b*, makes contact with the drain 132*c* not only by the side wall of the aperture 133 but also by the surface of the drain 132*c* around the edge of the aperture 133. This makes it possible to prevent a bad electrical connection between the drain 132*c* of the driving transistor 132 and the second contact electrode 184*b*.

Figure 9G:
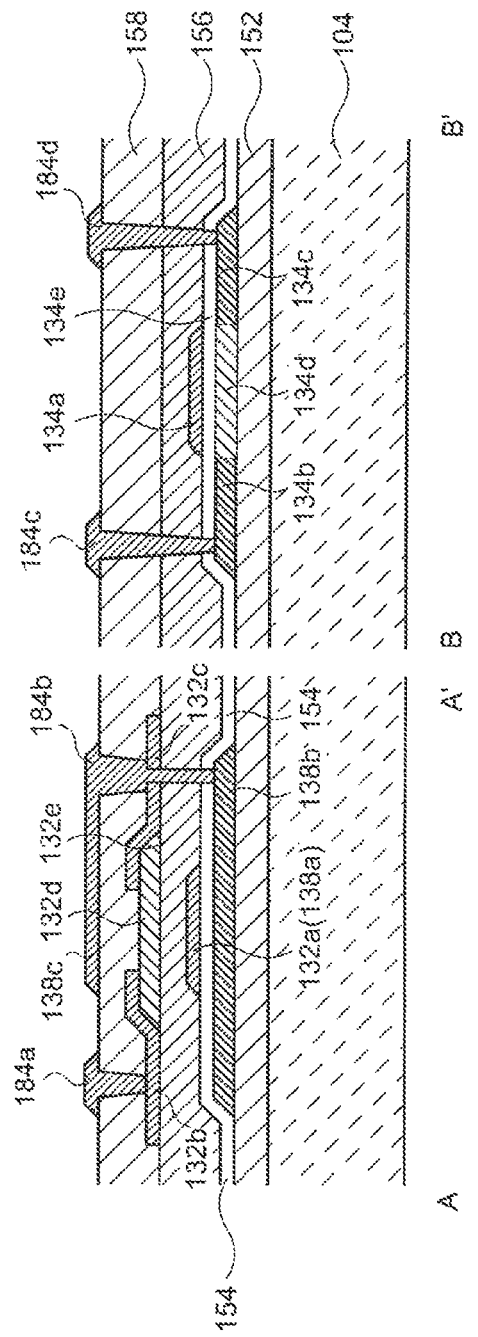
FIG. 9G is a cross-sectional view illustrating a method for manufacturing a display device according to an embodiment of the present invention.

Next, a third metal layer is formed, and the third metal layer is patterned by a photolithography step (FIG. 9G). This step allows the video signal line 142, the drive power line 144, and the jumper wire 148 to be formed, and also allows the first contact electrode 184*a*, the second contact electrode 184*b*, the third contact electrode 184*c*, and the fourth contact electrode 184*d* to be formed. The next and subsequent steps are the same as those of the first embodiment and, as such, are not described here.

The foregoing has described the configuration of and the method for manufacturing the display device 200 according to the second embodiment. The display device 200 according to the second embodiment can satisfy constraint conditions pertaining to the width of the frame (bezel), power consumption, and the like of the display device by using polycrystalline silicon in the transistors that constitute the peripheral circuit. Further, the use of an oxide semiconductor in the driving transistor 132, which constitutes the pixel circuit 130, makes it possible to reduce variations in the amount of light that are emitted by the pixels 110. Further, the use of polycrystalline silicon in the selecting transistor 134, which constitutes the pixel circuit 130, makes it possible to suppress an increase in resistance between the video signal line 142 and the gate 132*a* of the driving transistor 132 in an on-state of the selecting transistor 134. Furthermore, the overlapping disposition of the driving transistor 132 and the retention capacitor 138 in a plan view makes it possible to reduce the size of the pixels 110, allowing the display device 200 to be high in definition.

While some embodiments of the present invention have been described above, the present invention is not limited to the embodiments described above but may be applied in many variations without departing from the spirit of the present invention, and such variations are encompassed in the scope of the present invention.

What is claimed is:

1. A semiconductor device comprising:
    a first transistor; and
    a capacitor, wherein
    the first transistor has a bottom-gate structure, and includes a first semiconductor layer, a first conductive layer as a gate electrode of the first transistor, and a first insulating layer between the first semiconductor layer and the first conductive layer,
    the capacitor includes a second semiconductor layer as a first electrode, the first conductive layer as a second electrode, and a second insulating layer between the second semiconductor layer and the first conductive layer, and
    the first conductive layer is between the first semiconductor layer and the second semiconductor layer.

2. The semiconductor device according to claim 1, wherein
    the first electrode of the capacitor is electrically connected to a source or a drain of the first transistor.

3. The semiconductor device according to claim 1, further comprising a second transistor, wherein
    the second transistor has a top-gate structure, and includes a third semiconductor layer, a second conductive layer as a gate electrode of the second transistor, and the second insulating layer between the third semiconductor layer and the second conductive layer.

4. The semiconductor device according to claim 3, wherein
    the first conductive layer and the second conductive layer are located at the same level, and
    the second semiconductor layer and the third semiconductor layer are located at the same level.

5. The semiconductor device according to claim 1, wherein
    the first semiconductor layer includes an oxide semiconductor, and
    the second semiconductor layer and the third semiconductor layer include a polycrystalline silicon.

6. The semiconductor device according to claim 1, wherein
    a thickness of the first insulating layer is greater than a thickness of the second insulating layer.

* * * * *